(12) United States Patent
Insley et al.

(10) Patent No.: US 7,955,570 B2
(45) Date of Patent: Jun. 7, 2011

(54) LOW PRESSURE DROP, HIGHLY ACTIVE CATALYST SYSTEMS USING CATALYTICALLY ACTIVE GOLD

(75) Inventors: Thomas I. Insley, Lake Elmo, MN (US);
Larry A. Brey, Woodbury, MN (US);
Gina M. Buccellato, Eagan, MN (US);
Duane D. Fansler, Dresser, WI (US);
Marvin E. Jones, Grant, MN (US);
Badri Veeraraghavan, Woodbury, MN (US); Thomas E. Wood, Stillwater, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 378 days.

(21) Appl. No.: 12/279,768

(22) PCT Filed: Feb. 28, 2007

(86) PCT No.: PCT/US2007/062970
§ 371 (c)(1),
(2), (4) Date: Aug. 18, 2008

(87) PCT Pub. No.: WO2007/106664
PCT Pub. Date: Sep. 20, 2007

(65) Prior Publication Data
US 2010/0221159 A1    Sep. 2, 2010

Related U.S. Application Data

(60) Provisional application No. 60/777,859, filed on Feb. 28, 2006, provisional application No. 60/778,663, filed on Mar. 2, 2006.

(51) Int. Cl.
*B01J 8/02* (2006.01)
*B01D 50/00* (2006.01)
*B01J 23/02* (2006.01)

(52) U.S. Cl. ........ 422/222; 422/211; 422/177; 422/180; 502/344; 502/330; 423/246; 423/247

(58) Field of Classification Search .................. 422/211, 422/222, 177, 180; 502/344, 330; 423/246, 423/247
See application file for complete search history.

(56) References Cited

U.S. PATENT DOCUMENTS
4,469,640 A    9/1984  Carcia et al.
(Continued)

FOREIGN PATENT DOCUMENTS
EP    0 827 779 A    3/1998
(Continued)

OTHER PUBLICATIONS

Yeong-Jey Chen and Chuin-Tih Yeh, Deposition of Highly Dispersed Gold on Alumina Support, Apr. 18, 2001, vol. 200, Journal of Catalysis, Academy Press, pp. 59-68.

(Continued)

*Primary Examiner* — Walter D Griffin
*Assistant Examiner* — Lessanework Seifu
(74) *Attorney, Agent, or Firm* — Kenneth B. Wood

(57) ABSTRACT

Highly active, low pressure drop catalyst systems. Catalytically active material is provided on at least a portion of the channel sidewalls of a body comprising one or more flow-through channels. The channel sidewalls preferably bear a charge, e.g., an electrostatic or electret charge, to help adhere the catalytically active material to the sidewall. The catalytically active material preferably includes gold provided on a particulate support, and PVD techniques are used to deposit catalytically active gold onto the support. Optionally, the gold-bearing particulates may be charged as well in a manner to facilitate attraction between the particulates and the sidewalls.

24 Claims, 13 Drawing Sheets

U.S. PATENT DOCUMENTS

| | | | |
|---|---|---|---|
| 4,536,482 | A | 8/1985 | Carcia |
| 5,058,578 | A | 10/1991 | Weiss |
| 5,492,627 | A | 2/1996 | Hagen et al. |
| 5,789,337 | A | 8/1998 | Haruta |
| 5,932,750 | A | 8/1999 | Hayashi |
| 6,265,341 | B1 | 7/2001 | Komatsu |
| 6,280,824 | B1 | 8/2001 | Insley et al. |
| 6,524,488 | B1 | 2/2003 | Insley et al. |
| 6,752,889 | B2 | 6/2004 | Insley et al. |
| 7,243,658 | B2 | 7/2007 | Deevi |
| 2003/0042226 | A1 | 3/2003 | Coll et al. |
| 2003/0134741 | A1 | 7/2003 | Weisbeck |
| 2003/0187294 | A1 | 10/2003 | Hagemeyer et al. |
| 2004/0176246 | A1 | 9/2004 | Shirk et al. |
| 2005/0095189 | A1 | 5/2005 | Brey et al. |
| 2006/0293175 | A1 | 12/2006 | Dai et al. |
| 2007/0207079 | A1 | 9/2007 | Brady et al. |

FOREIGN PATENT DOCUMENTS

| | | |
|---|---|---|
| EP | 1 040 869 A2 | 10/2002 |
| GB | 1 486 108 A | 9/1977 |
| JP | 1-94945 | 4/1989 |
| JP | 03123625 | 5/1991 |
| WO | WO 98/00413 A | 1/1998 |
| WO | WO 00/59632 A | 10/2000 |
| WO | WO 2004112958 | 12/2004 |
| WO | WO 2008/076137 | 6/2008 |

OTHER PUBLICATIONS

Arri, et al., Oxidation of CO on Gold Supported Catalysts Prepared by Laser Vaporization: Direct Evidence of Support Contribution; Journal of the American Chemical Society 2004; 126; 1199-1205.

Haruta, Size and Support-dependency in the catalysis of gold; Catalysis Today, 36:153-166, 1997.

Kobayashi, et al., Thin Films of Supported Gold Catalysts for CO Detection; Sensors and Actuators B1 1990; 222-225.

Okamura, et al., Preparation of supported gold catalysts by gas-phase grafting of gold acetylacetonate for low-temperature oxidation of CO and of H2; Journal of Molecular Catalysis 2003; 199, 73-84.

Prati, Gold on Carbon as a New Catalyst for Selective Liquid Phase Oxidation; Journal of Catalysis 176, 552-560 (1998).

Veith, et al., Nanoparticles of Gold on Al2O3 produced by dc magnetron sputtering; Journal of Catalysis 2004; 213, 151-158.

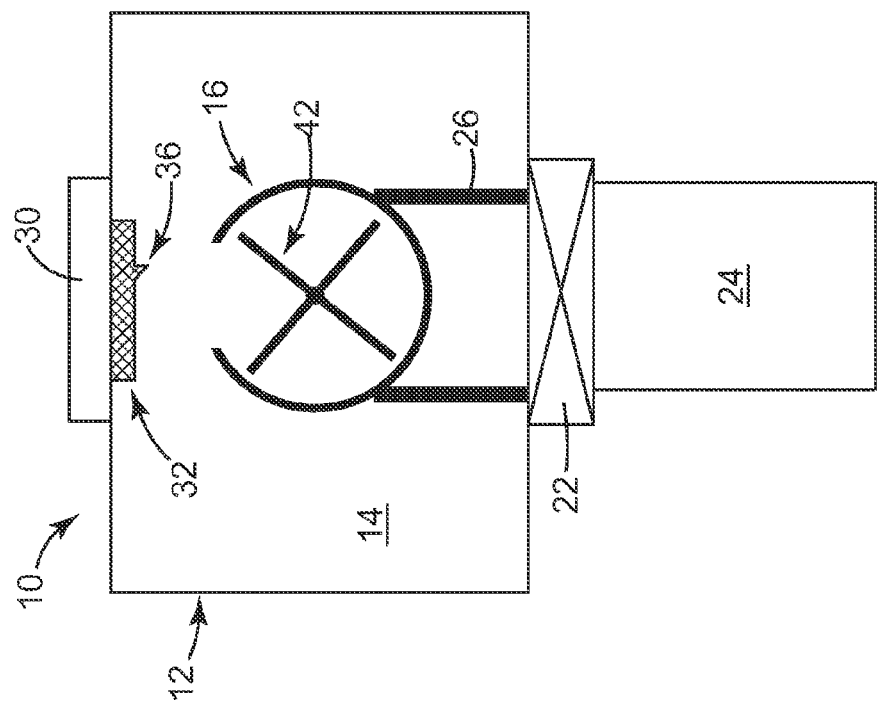
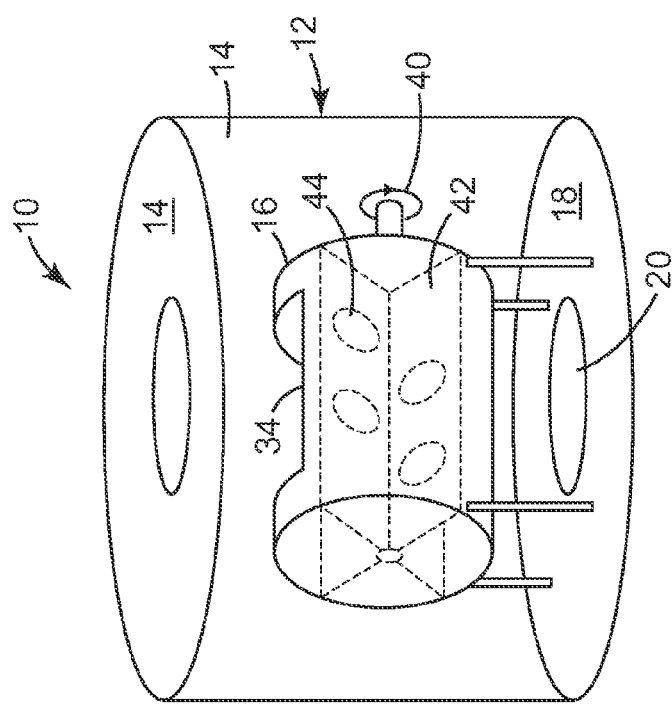

LOW PRESSURE DROP, HIGHLY ACTIVE CATALYST SYSTEMS USING CATALYTICALLY ACTIVE GOLD

CROSS REFERENCE TO RELATED APPLICATIONS

This application is a national stage filing under 35 U.S.C. 371 of PCT/US2007/062970, filed Feb. 28, 2007, which claims priority to U.S. Provisional Application No. 60/777,859 filed Feb. 28, 2006, and to U.S. Provisional Application No. 60/778,663 filed Mar. 2, 2006, the disclosures of which are incorporated by reference in their entirety herein.

PRIORITY CLAIM

The present non-provisional patent application claims priority under 35 USC §119(e) from U.S. Provisional Patent Application having Ser. No. 60/777,859, filed on Feb. 28, 2006, by Thomas I. Insley, and titled LOW PRESSURE DROP, HIGHLY ACTIVE CATALYST SYSTEMS USING CATALYTICALLY ACTIVE GOLD, and from U.S. Provisional Patent Application having Ser. No. 60/778,663, filed Mar. 2, 2006, by Thomas I. Insley, and titled LOW PRESSURE DROP, HIGHLY ACTIVE CATALYST SYSTEMS USING CATALYTICALLY ACTIVE GOLD, wherein the entireties of said provisional patent applications are each incorporated herein by reference in their respective entireties.

FIELD OF THE INVENTION

The present invention relates to gold-based catalyst systems. More specifically, the present invention relates to catalyst systems in which a catalytically active material such as gold or other metal is supported directly or indirectly upon surface(s) associated with flow-through channels. The catalytically active material may be provided on or within the sidewalls of the channels so that the material maintains fluidic communication with the fluid stream conveyed through the channel(s) and to be treated by the catalyst. Desirably, the gold or other catalytically active material is provided on suitable particulate supports, which in turn are further supported upon host media comprising one or more charged surfaces of the flow-through channels.

BACKGROUND OF THE INVENTION

Carbon monoxide is a toxic gas formed by incomplete burning of organic materials. Carbon monoxide combines with blood hemoglobin to form carboxyhemoglobin which is ineffective at transporting oxygen to body cells. Inhalation of air containing 1-2% (10,000 to 20,000 ppm) CO by volume will cause death within several minutes. CO concentrations higher than 1200 ppm are considered immediately dangerous to life and health by the U.S. National Institute of Occupational Safety and Health (NIOSH).

CO is responsible for many of the fatalities in fires. It is also encountered in mining operations in which explosives are used in confined spaces. CO is also present in the exhausts of gasoline or diesel powered internal combustion engines. Poorly operating engines, machinery, heating equipment, ventilation equipment, air conditioning equipment, and other equipment may also output CO, contaminating the air in buildings and vehicles. Consequently, there is a strong need for protection against CO in these and other environments in which persons could encounter the gas.

Firefighters and other emergency response personnel have been equipped with self-contained respirators using compressed air or oxygen in cylinders to provide protection against CO. These devices tend to be heavy, bulky, expensive and require special training for effective use. It is not feasible to equip everyone in an area with such devices.

A fire or other sudden unexpected release of carbon monoxide in a building, public place, vehicle, mine, submarine, other marine vessel, or the like may require that individuals quickly escape from an area containing dangerous concentrations of the gas. In these situations, an easy-to-use, lightweight respirator or mask equipped with media capable of protecting against carbon monoxide would be desirable. In other situations where escape from the exposure environment is not readily achievable such as in an airplane, submarine, skyscraper, or mine a system that provides collective protection against carbon monoxide would be desirable. A collectively protected environment is one in which the atmosphere in which a collection of people is treated rather than individuals. Collective protection provides an area free of carbon monoxide in which individual protective devices such as masks or respirators need not be worn.

Protection against CO is also desirable in the cabin environment of a car, truck, rail-borne vehicle, marine vessel, or other mode of transport. In many heavily congested traffic areas and in tunnels, elevated levels of CO can develop from the accumulation of exhaust emissions. Typically, the CO levels encountered are usually less than 200 to 300 ppm, but even these CO levels can cause headaches, dizziness and nausea to drivers and passengers. In these applications, large volumes of gas and high flow rates can be encountered. Thus, the residence time of the cabin air on the media is short, being less than 0.05 seconds and even less than 0.03 seconds. It is therefore desirable to have a media that can also remove CO under these conditions.

However, the low boiling point and high critical temperature of CO make its removal by physical adsorption very difficult when the CO is present at room temperature. Conventional gas mask canisters and filters based on activated carbon adsorbents have been relatively useless as a practical matter against high concentrations of carbon monoxide.

Catalytic oxidation to carbon dioxide is one feasible method for removing carbon monoxide from air at the high concentrations and flow rates required for individual respiratory protection. However, many CO oxidation catalysts are only active at temperatures of 150° C. or higher. This is true even though oxidation to $CO_2$ is thermodynamically favored. Very few CO oxidation catalysts are active at room temperature or below. A catalyst useful for respiratory protection against CO desirably functions at low temperatures.

Two types of catalysts that are known for low temperature CO oxidation include transition metal oxides (mostly mixed oxides of Cu, Mn, and/or Co) and supported noble metal catalysts. One widely used transition metal oxide for low temperature CO oxidation is hopcalite. Hopcalite is a mixed oxide of manganese and copper developed during World War I by the U.S. Bureau of Mines and the Chemical Warfare Service of the U.S. Army [Lamb, Bray, and Frazer, *J. Ind. Eng. Chem.*, 12, 213 (1920)]. Hopcalite is a very active catalyst for CO oxidation even at temperatures as low as −20° C. The major disadvantage of hopcalite is that its capability for CO oxidation is quickly destroyed by water vapor in the air. This means that a respirator filter with a hopcalite catalyst must include a drier bed on the inlet side of the filter. The useful life of the respirator filter is determined by the capacity and efficiency of the drier bed. Even a filter designed for short term use (~30 minutes) at high breathing rates will require a desiccant bed of larger volume than the catalyst bed itself. Hopcalite is commercially available from Cams Chemical Company, 315 Fifth Street, Peru, Ill. 61354 USA under the designation Carulite 300.

Catalytic oxidation of CO over supported platinum group metals (most often Pt, Pd, Rh, Ru, and Ir) has been known for many years. However, most of these catalysts are only active at temperatures around 150° C.

In recent years, supported platinum group metal catalysts have been developed that function at lower temperatures. In addition to a platinum group metal, these catalysts may also contain so-called "reducible metal oxides" such as $SnO_x$, $CeO_x$, and $FeO_x$. It is thought that the reducible oxides provide sites that dissociatively adsorb $O_2$, thereby promoting low temperature CO oxidation. U.S. Pat. No. 4,536,375 and Published UK Patent Application GB 2,141,349 discuss these catalysts and their use in respiratory protection devices. A low temperature CO oxidation catalyst of this type is commercially available from Molecular Products Ltd, Mill End, Thaxted, Essex CM6 2LT, United Kingdom under the designation Sofnocat® 423. It contains platinum, palladium, and $SnO_2$.

These platinum-based catalysts are much more tolerant of water vapor than is hopcalite. However, operation at high relative humidity (RH) with low CO inlet concentrations results in capillary condensation of water vapor in the micropores of the catalyst support (usually alumina or silicagel). This causes slow loss of activity as access to active sites is blocked by condensed water. A significant disadvantage of these catalysts is the high loading of expensive platinum group metal necessary to meet the requirements for respiratory protection against CO.

It has been observed that nanoislands of very finely divided gold on reducible oxide supports are very active for CO oxidation at low temperature. At ambient to sub-ambient temperatures, the best gold catalysts are considerably more active for CO oxidation than the most active promoted platinum group metal catalyst known. Gold is also considerably cheaper than platinum. Catalytically active gold, though, is quite different from the platinum group metal catalysts discussed above. The standard techniques used in the preparation of supported platinum group metal catalysts give inactive CO oxidation catalysts when applied to gold. Different techniques, therefore, have been developed for deposition of finely divided gold on various supports. Even so, highly active gold catalysts have been difficult to prepare reproducibly. Scaleup from small lab preparations to larger batches has also proved difficult.

These technical challenges have greatly hindered the industrial application of gold catalysts. This is unfortunate since the very high activities of gold catalysts for CO oxidation at ambient and sub-ambient temperatures and their tolerance for high water vapor concentrations make them otherwise strong candidates for use in respiratory protection filters and in other applications in which oxidation of CO would be desired.

Because ultra-fine particles of gold generally are very mobile and possess large surface energies, ultra-fine particles of gold tend to coagulate easily. This tendency to coagulate makes ultrafine gold hard to handle. Coagulation also is undesirable inasmuch as the catalytic activity of gold tends to fall off as its particle size increases. This problem is relatively unique to gold and is much less of an issue with other noble metals such as platinum (Pt) and palladium (Pd). Thus, it is desired to develop methods to deposit and immobilize ultra-fine gold particles on a carrier in a uniformly dispersed state.

Known methods to deposit catalytically active gold on various supports recently have been summarized by Bond and Thompson (G. C. Bond and David T. Thompson, *Gold Bulletin,* 2000, 33(2) 41) as including (i) coprecipitation, in which the support and gold precursors are brought out of solution, perhaps as hydroxides, by adding a base such as sodium carbonate; (ii) deposition-precipitation, in which the gold precursor is precipitated onto a suspension of the preformed support by raising the pH, and (iii) Iwasawa's method in which a gold-phosphine complex (e.g., [Au(PPh$_3$)]NO$_3$) is made to react with a freshly precipitated support precursor. Other procedures such as the use of colloids, grafting and vapor deposition, have met with varying degrees of success.

These methods, however, suffer from difficulties aptly described by Wolf and Schuth, Applied Catalysis A: General, 2002, 226 (1-2) 1-13 (hereinafter the Wolf et al. article). The Wolf et al. article states that "[a]lthough rarely expressed in publications, it also is well known that the reproducibility of highly active gold catalysts is typically very low." The reasons cited for this reproducibility problem with these methods include the difficulty in controlling gold particle size, the poisoning of the catalyst by ions such as Cl, the inability of these methods to control nano-sized gold particle deposition, the loss of active gold in the pores of the substrate, the necessity in some cases of thermal treatments to activate the catalysts, inactivation of certain catalytic sites by thermal treatment, the lack of control of gold oxidation state, and the inhomogeneous nature of the hydrolysis of gold solutions by the addition of a base.

In short, gold offers great potential as a catalyst, but the difficulties involved with handling catalytically active gold have severely restricted the development of commercially feasible, gold-based, catalytic systems.

German Patent Publication DE 10030637 A1 describes using PVD techniques to deposit gold onto support media. The support media described in this document, though, are merely ceramic titanates made under conditions in which the media would lack nanoporosity. Thus, this document fails to indicate the importance of using nanoporous media to support catalytically active gold deposited using PVD techniques. International PCT Patent Publications WO 99/47726 and WO 97/43042 provide lists of support media, catalytically active metals, and/or methods for providing the catalytically active metals onto the support media. These two documents, however, also fail to appreciate the benefits of using nanoporous media as a support for catalytically active gold deposited via PVD. Indeed, WO 99/47726 lists many preferred supports that lack nanoporosity.

Relatively recently, very effective, heterogeneous catalyst systems and related methodologies using catalytically active gold have been described in assignee's co-pending U.S. patent applications having U.S. Ser. No. 10/948,012, titled CATALYSTS, ACTIVATING AGENTS, SUPPORT MEDIA, AND RELATED METHODOLOGIES USEFUL FOR MAKING CATALYST SYSTEMS ESPECIALLY WHEN THE CATALYST IS DEPOSITED ONTO THE SUPPORT MEDIA USING PHYSICAL VAPOR DEPOSITION in the names of Larry Brey et al., and filed Sep. 23, 2004); U.S. Ser. No. 11/275,416, titled HETEROGENEOUS, COMPOSITE, CARBONACEOUS CATALYST SYSTEM AND METHODS THAT USE CATALYTICALLY ACTIVE GOLD in the names of John T. Brady et al., and filed Dec. 30, 2005, the respective entireties of which are incorporated herein by reference (hereinafter referred to as Assignee's Co-pending Applications). These catalyst systems provide excellent catalytic performance with respect to CO oxidation. Representative embodiments provide gold-based catalyst systems that demonstrate a desirably fast response to changes in incident CO challenges. Representative embodiments also provide long lasting protection against CO.

Further improvements in gold-based catalyst systems still are desired. Specifically, it would be desirable to provide highly active, low pressure drop, ΔP, catalyst media. Lower pressure drop is desirable, because less energy is required to transport fluids through the catalytic system. As a result, energy sources can be smaller, less expensive, lighter in weight, easier to manufacture and service, longer-lasting, and/or the like. Lower pressure drop would be highly desirable in many catalytic applications such as applications involving oxidation catalyst systems having mechanical and/or powered gas management systems. Examples of these include portable, powered, personal protection devices and collective protection systems for vehicles, buildings, fuel cell PROX systems, and the like. Increased activity may be achieved, according to one approach, by using finer gold-bearing particles as catalysts. It is believed that finer particles tend to provide the desired increased activity, at least in part, due to the greater surface area of smaller particles.

However, achieving both low ΔP and increased activity via small particles are in conflict. Small particles are useless as a practical matter in packed bed configurations due to the resultant high pressure drop through the bed. In short, lower ΔP tends to be achieved at the expense of catalytic activity and vice versa. Consequently, significant technical challenges must be overcome to provide highly active, low pressure drop, ΔP, catalyst media, particularly if the catalytically active gold is supported upon very fine particles.

SUMMARY OF THE INVENTION

The present invention provides highly active, low pressure drop catalyst systems. As an overview of the practice of the present invention, catalytically active metal such as gold is supported directly or indirectly upon surface(s) associated with flow-through channels. The catalytically active material is provided on or within the sidewalls of the channels so that the gold-bearing particles maintain fluidic communication with the fluid stream conveyed through the channel(s) and to be treated by the catalyst. Even though the catalytically active material might only be provided on such surfaces, catalytic treatment of a fluid moving through the channels proceeds to a surprising extent.

In preferred embodiments, the catalytically active material is a catalytically active metal such as gold and is deposited onto particulate supports, which in turn are provided on the surfaces associated with the flow-through channels. Desirably, and particularly in the case of gold, PVD techniques are used to deposit catalytically active metal onto a support having nanoscale surface features, e.g., nanoporosity or the like, of a sufficiently fine size to help immobilize finely sized gold clusters in a manner effective to preserve catalytic activity of the gold. Such supports may be formed from constituents comprising one or more different kinds of particles. The support can be very finely sized without having an undue impact on pressure drop characteristics. When the particulate support is derived from two or more constituent particles, these may be intermixed, assembled into guest/host structures (as described below), aggregated, agglomerated, and/or otherwise assembled to form the desired particulate support. These particle constituents may be regular in shape, dendritic, dendrite-free, acicular, or the like. When two or more kinds of constituent particles are assembled into larger structures to form the resultant particulate support, the particulate nature of at least one of the particle constituents desirably is at least partially retained. This helps to provide the desired nanoscale topography.

In order to provide a surface with nanoscale features effective to help immobilize finely sized gold material, one or more of these particle constituents desirably may be nanoporous as supplied. Alternatively, a nanoporous, nanoscale topography may result when one or more kinds of particles are assembled into the desired particulate support structure. Suitable nanoscale features may also be provided by a surface having a surface texture of nanoscale dimensions, e.g., depth, width, and/or height, comparable to the desired size of the gold clusters. For instance, if the gold clusters desirably have a size in the range of about 0.5 nm to about 50 nm, preferably about 1 nm to about 10 nm, more preferably about 2 nm to about 5 nm in any dimension, the surface texture would have comparable dimensions.

The catalyst-bearing nanoporous particles are provided on or within the sidewalls of one or more flow-through channels so that the catalyst-bearing nanoporous particles maintain fluidic communication with the fluid stream that flows through the channel(s) and is to be treated by the catalyst. Optionally, the channel sidewalls preferably bear a charge, e.g., an electrostatic or electret charge, to help hold the catalyst-bearing particulates to the sidewall. Optionally, the catalyst-bearing particulates may be charged in a manner to facilitate attraction between the particulates and the sidewalls.

The resulting catalyst systems are very catalytically active and can display very low pressure drop characteristics, even at high flow-through for the fluid stream to be treated. Since the catalyst system is open-channeled there is also less potential for fouling (plugging) when compared to traditional filtration systems or packed beds.

There is a wide range of applications for such catalyst systems. These include CO abatement for personal, vehicle and building protection, catalysts and catalyst supports for the purification of exhaust gases from internal combustion engines; as hydrogenation catalyst; oxidation of hydrocarbons; water or $H_2O_2$ production; oxidation of ammonia; fine chemical synthesis; in sensors for detection and measurement of gases and vapors; and catalysts for other oxidation reactions such as the oxidation of carbonaceous soot in diesel exhaust streams and the selective oxidation of organic compounds. The heat evolved from the catalytic oxidation of CO could possible be tapped in a co-generation/CO remediation process using high flow type catalyst systems of the invention fitted with heat-exchange elements.

For instance, the gold-based catalyst systems would be suitable as catalyst systems for the catalytic oxidation of unsaturated and saturated hydrocarbons, particularly vapor or gas phase reactions. The term hydrocarbon means unsaturated or saturated hydrocarbons such as olefins or alkanes. The hydrocarbon can also contain heteroatoms like N, O, P, S or halogens. The organic compounds to be oxidized may be acyclic, monocyclic, bicyclic, or polycyclic and may be mono-olefinic, di-olefinic, or poly-olefinic. The double bonds in compounds with two or more double bonds may be conjugated or non-conjugated.

The catalyst systems of the present invention would be useful in PROX applications, where it is desired to selectively oxidize CO relative to hydrogen. The catalytically processed, hydrogen-rich feed may be used as a feedstock for a hydrogen fuel cell. In these applications, the catalytically active particles may be prepared as described in Assignee's co-pending U.S. Provisional Patent Application having Ser. No. 60/773, 866, filed Feb. 15, 2006, titled Selective Oxidation of Carbon Monoxide Relative to Hydrogen Using Catalytically Active Gold, and naming inventor(s) including Larry A. Brey; and U.S. Provisional Patent Application having Ser. No. 60/774, 045, filed Feb. 15, 2006, titled Catalytically Active Gold Supported on Thermally Treated Nanoporous Supports, and naming inventor(s) including Larry A. Brey, the respective entireties of which are incorporated herein by reference for all purposes.

The catalysts of the present invention would be suitable for use in the demanding application of removal of CO from gas streams in automotive cabin air purification. In this application, large volumes of gas and high flow rates can be encountered. Thus, the residence time of the cabin air on the catalyst is short, being less than 0.05 seconds and even less than 0.03 seconds. Typically, the CO levels encountered are low, usually less than 200 ppm. The catalysts of the present invention have been shown to perform very well in these conditions and can be used in a variety of configurations in cabin air purification for a wide range of vehicles and vessels that carry passengers.

Besides being lower in pressure drop, our system has the advantage of being able to utilize very small catalytic particles. Often, one finds that small particles have increased activity due to having increased surface area. Unfortunately, these particles are useless in packed bed configurations due to their extremely high pressure drops.

For example, our supported catalysts are ultra active while displaying $\Delta P$ values <0.4 mm $H_2O$ at flow rates of humidified air of about 64 Lpm (liters per minute) or less. In one embodiment, a 3M brand high air flow (HAF) disk was loaded with about 18 g of very small catalytically active particulates of the present invention and then tested at 64 Lpm (CO=3600 ppm). The catalytically active HAF disk exhibited a 99.9+% conversion of CO to $CO_2$. A 62 cm$^2$ packed bed of equivalent mass using 12×20 mesh catalyst particles would have a pressure drop greater than 15 mm $H_2O$ for the same conversion.

The catalyst system of the present invention is very flexible and could be used in combination with other types of mechanical filters, packed beds and the like without adding to the energy requirements of the system. In some embodiments, such additional filtering media could be positioned upstream in an integrated system to help protect the present catalyst from other contaminants, poisoning, and the like.

In one aspect, the present invention relates to a catalyst system, comprising:
  a fluid conduit having an inner surface defining at least a portion of a flow-through channel; and
  a plurality of catalytically active particles provided on at least a portion of the inner surface, said particles comprising a gold catalyst.

In another aspect, the present invention relates to a catalyst system, comprising:
  a fluid conduit having an inner surface defining at least a portion of a flow-through channel; and
  a plurality of catalytically active, composite particles provided on at least a portion of the inner surface, said composite particles having a guest/host structure comprising a plurality of guest particles and a plurality of host particles, wherein a catalyst is provided on the guest particles.

In another aspect, the present invention relates to a catalyst system, comprising:
  an array of fluid conduits, each fluid conduit having an inner surface defining at least a portion of a flow-through channel; and
  a gold catalyst provided on at least a portion of the inner surfaces of the conduits.

In another aspect, the present invention relates to a method of making a catalyst system, comprising the steps of:
  providing a plurality of catalytically active particles comprising a gold catalyst;
  providing a fluid conduit having an inner surface defining at least a portion of a flow-through channel; and
  causing the particles to be supported on at least a portion of the inner surface.

In another aspect, the present invention relates to a method of making a catalyst system, comprising the steps of:
  providing a plurality of catalytically active, composite particles having a guest/host structure comprising a plurality of guest particles and a plurality of host particles, wherein a catalyst is provided on the guest particles;
  providing a fluid conduit having an inner surface defining at least a portion of a flow-through channel; and
  causing the composite particles to be supported on at least a portion of the inner surface.

In another aspect, the present invention relates a method of catalytically oxidizing a substance, comprising the steps of:
  providing a catalyst system according to the present invention; and
  causing a fluid comprising the substance to flow through the system under conditions such that at least a portion of the substance is oxidized.

BRIEF DESCRIPTION OF THE DRAWINGS

FIG. 2 is a schematic perspective view of an apparatus for carrying out a PVD process for depositing catalytically active gold onto a support.

FIG. 3 is a schematic side view of the apparatus of FIG. 2.

DETAILED DESCRIPTION

Figure 1:
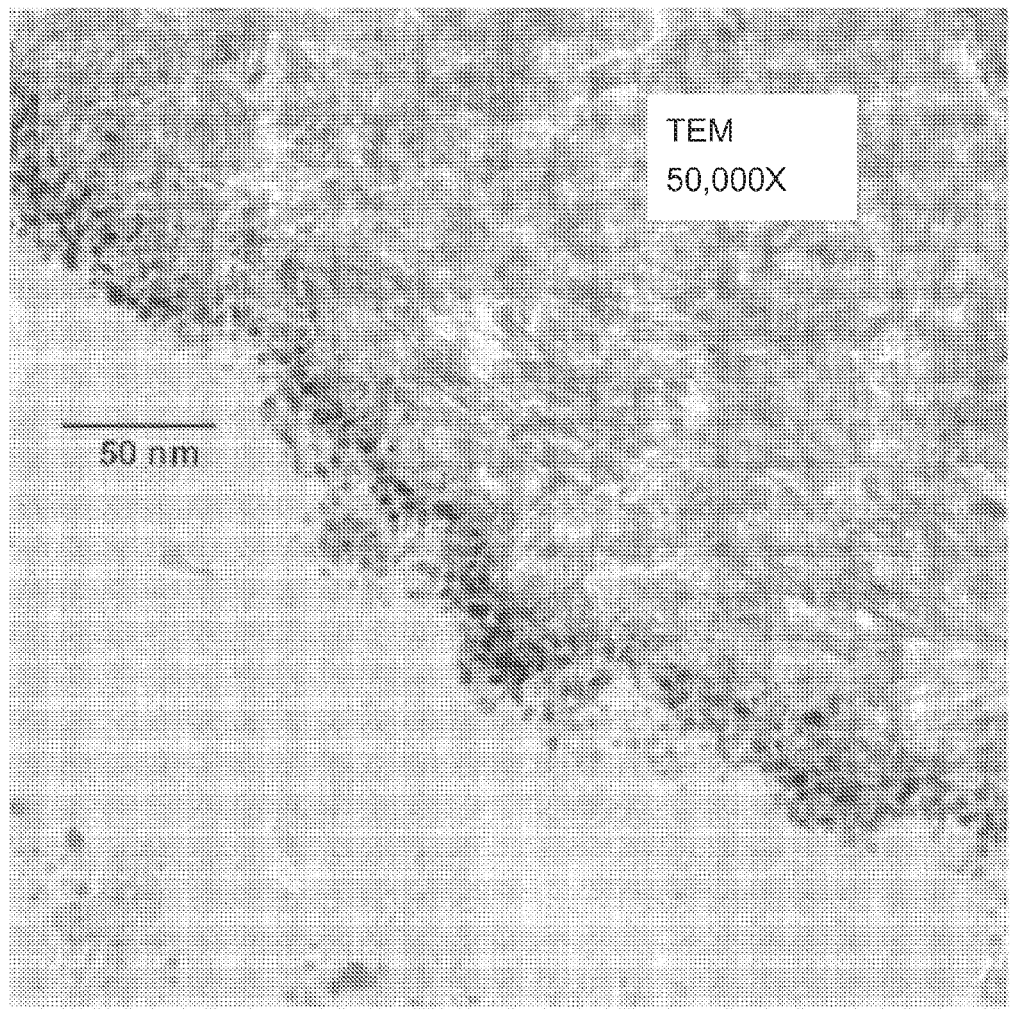
FIG. 1 is a TEM image of a cross-section of a representative catalyst surface of the present invention (material of Example 3 of Assignee's Co-Pending Application cited above).

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. The preferred embodiments of the present invention will now be described in the context of using catalytically active gold as the catalytically active material for purposes of illustration, although it will be appreciated that the invention may use other catalytically active materials singly or in combination.

We have found that surface deposition/coating of catalytically active metal such as gold onto the nanoscale topography of nanoporous media provides catalyst systems with excellent performance. In the case of gold, for example, it appears that these nanoscale features help to immobilize the gold, preventing gold accumulation that might otherwise result in a loss of performance. This stabilization of the very small gold particles and clusters is evidenced by both the direct observation of smaller particles of gold in TEM studies of materials possessing nanoporous surfaces and in higher catalytic activity as measured by the ability of the catalyst to convert CO to $CO_2$ in the presence of air. Otherwise, if gold is not immobilized, it will tend to accumulate into larger masses and lose catalytic activity. Advantageously, gold is also readily deposited onto nanoporous supports using PVD in a catalytically active state without requiring additional thermal or other treatment for activation.

In the practice of the present invention, the particulate support supporting the catalytically active gold desirably is nanoporous in order to provide such nanoscale features. Nanoporosity generally means that the support includes pores having a width of about 100 nm or less, more typically a width in the range of about 1 nm to about 30 nm. Nanopores can be observed in the support material, and corresponding nanopore size can be measured, via transmission electron microscopy (TEM) analysis. It is important to note that the support materials only need be nanoporous in the exterior volume proximal to the surface region of the support, e.g., the exterior volume corresponding to the penetration depth of the deposited gold, particularly when gold is deposited via line of sight, PVD techniques. Preferably, nanoporosity extends to a depth equal to or greater than the penetration depth of the gold atoms deposited via such PVD techniques.

The nanoporous nature of a support may also be characterized by a technique such as described in ASTM Standard Practice D 4641-94 in which nitrogen desorption isotherms are used to calculate the pore size distribution of catalysts and catalyst supports in the range from about 1.5 to 100 nm. When using this method, preferred supports have a total nanoporous capacity for pores in the size range of 1 to 10 nm in the volume corresponding to the penetration depth of the gold that is greater than 20% (i.e., greater than about 0.20 using the formula below) of the total pore volume of the support material in the range from 1 to 100 nm as calculated using the following formula with data obtained from ASTM D4641-94, the entirety of which is incorporated herein by reference:

$$NPC = \frac{CPv_1 - CPv_{10}}{CPv_1 - CPv_{100}}$$

wherein NPC refers to the nanoporous capacity; $CPv_n$ refers to the cumulative pore volume at pore radius n in $cm^3/g$; and n is the pore radius in nanometers.

In representative embodiments, the nanoparticulate ingredients used to form the support material of the present invention may be nanoporous per se. Alternatively, the nanoparticles may be nonporous as supplied, but can be made to possess exterior surfaces characterized by nanoporosity via aggregation, coating, chemical or thermal treatment, and/or the like. For instance, representative methodologies include adsorption of nanoparticulate material such as gels and nanoparticle size colloids on the surface of a larger, host material to form a composite with the desired nanoporosity; hydrolysis of metal alkoxides or metal salts on the surface of a material to form the nanoporous materials; and oxidation of a thin coating of metal, e.g., aluminum, titanium, tin, antimony or the like, on the surface of a material to form a nanoporous material. In the latter case, the thin metal films can be deposited by physical vapor methods and the oxidation can be carried out by dry or moist air to produce a nanoparticle film on the substrate.

In preferred embodiments in which the nanoparticles include titania particles, aggregates of titania particles, or clusters of such aggregates, the titania nanoparticles may themselves contain some nanopores in the range of 1 nm to 5 nm. Representative agglomerates of titania nanoparticles may include nanopores that are very fine, having a size in the range of 1 to 10 nm. The aggregate structures will also tend to further include additional pores that are larger, i.e., in the range of 10 to 30 nm. Still larger pores in the range of 30 to 100 nm are formed by the packing of the nanoparticle aggregates into larger clusters. Structures formed from these aggregates may also tend to include even larger pores having a size in the range of 0.1 micron to 2 micron, more preferably in the range of 0.1 micron to 1.0 micron and most preferably in the range of 0.1 micron to 0.5 micron.

The support material formed from these agglomerates advantageously has the larger pores present at a level of 20 to 70% of the volume of the nanoparticulate media, preferably at a level of 30 to 60% of the volume of the nanoparticulate media, and most preferably at a level of 35 to 50% of the volume of the nanoparticulate media. The percent by volume of the larger pores can be measured by SEM and mercury porosimetry as is know to those skilled in the art.

Thus, in addition to nanoporosity, the substrate particles optionally may further have microporous, mesoporous, and/or macroporous characteristics as such are defined in applicable provisions of IUPAC Compendium of Chemical Technology, 2d edition (1997). A typical population of activated carbon or alumina support particles may be obtained that includes a combination of nanoporous, microporous, mesoporous, and macroporous properties, for instance. By having pores on several levels of size, very active catalysts can be made that both support very fine particles of gold while also allowing facile access to the active gold sites by the challenge gas. The larger pores in these structures are also particularly important in allowing the deposition of gold into the depth of the porous titania matrix via the PVD method.

In addition to porosity features, support media of the present invention preferably further include one or more additional characteristics. For instance, preferred embodiments of the support media are characterized by multiphasic, e.g., biphasic, surfaces. Multiphasic means that the surface has more than one phase. Our data show that catalytic activity is enhanced when gold is deposited onto a multiphasic surface. While not wishing to be bound, it is believed that the resultant phase boundaries on the surface appear to help stabilize gold. TEM studies as described herein and as is well known in the art can be used to assess whether a surface is biphasic. It is believed that these phase boundaries are very finely dispersed at the nanoscale, helping to make the boundaries effective for immobilizing gold.

The particulate support media may have any of a wide range of sizes. As general guidelines, particulate supports desirably have a size in the range of from about 0.5 nm to about 1000 micrometers. Finer particles are preferred, such as those having a particle size in the range of from about 0.5 nm to about 35 nm, more preferably about 3 nm to about 15 nm, and most preferably about 3 nm to about 8 nm. These finer sized particles preferably have a high surface area as measured by BET. The surface area is preferably greater than about 50 m$^2$/g, more preferably greater than about 150 m$^2$/g, and most preferably greater than about 300 m$^2$/g.

In representative embodiments, such finely sized nanoparticles may or may not themselves include nanoporosity, but they may aggregate to form a larger nanoporous aggregate structures, which may further form still larger aggregate clusters. Clusters of these aggregates generally may have a particle size in the range of 0.2 micron to 3 micron in size, more preferably in the range of 0.2 micron to 1.5 micron in size and most preferably in the range of 0.2 micron to 1.0 micron in size. In representative embodiments, the clusters of aggregated particles are further supported on a host material as described below. A particularly useful construction of the present materials is one involving the use of agglomerates of the treated nanoparticles wherein the nanoparticle agglomerates are packed to form layers possessing multi-modal, e.g., bi-modal or tri-modal, distributions of pores.

Nanoporous aggregate structures and aggregate clusters useful in the present invention can be formed for example by controlled aggregation of nanoparticle sols and dispersions. Controlled aggregation can be accomplished by mechanical dispersion of the nanoparticles at or near, e.g., within about 2 pH units, of the isoelectric point of the nanoparticles being used. Controlled aggregation can also be induced through raising of the ionic strength of the dispersion medium or by addition of flocculating agents as is known in the art.

It is a distinct advantage that the present invention can use such fine particles. Ordinarily, one would expect that fine particles might provide higher activity than coarser particles, but this would be accomplished at the expense of higher fluid flow resistance through the system. In the invention, the particles coat the sidewall surfaces of the flow-through channels, but the particle coating thickness is a very small percentage of the overall cross-sectional area of the corresponding channel. Thus, high activity associated with finer particles is achieved. Yet, because the particles coat at least portions of the sidewalls of the flow-through channels while the flow channels are otherwise unobstructed, very low ΔP (pressure drop) through the system occurs.

It is also surprising in representative modes of practice that the CO contaminant in a fluid stream moving through such channels can be so thoroughly catalytically oxidized when (1) only the walls of the channel bearing the particles are catalytically active, and (2) a large percentage of the volume of the channel is otherwise open and unobstructed, and (3) the length of the channel is relatively short. For instance, the examples below describe embodiments of the invention in which composite, nanoporous particles bearing catalytically active gold coat the walls of channels having a length of only about 2 cm and a cross-sectional area of about 2 mm$^2$. The particle coating on the sidewalls of such channels is on the order of 0.05 mm in thickness. The nanometer-dimensioned coating thus occupies a negligible proportion of the volume of the channel. Other than this coating, the channel is open and unobstructed.

Conventional wisdom might suggest that this catalytic approach would be ineffective. Specifically, because only a small fraction of the fluid moving through the channel contacts the coating at any one time (i.e. fluid more towards the central area of the channel that is farther from the sidewall might not ever have a chance to contact the sidewall), and because the residence time through a 2 cm long channel is relatively brief, only a small fraction of the CO contaminant in a fluid would be catalytically oxidized when transported through such a channel. Quite surprisingly, however, it has been found that over 99% of the CO content of a fluid stream can be catalytically oxidized when passing through these channels in preferred modes of practice. Moreover, this catalytic activity can be sustained for long periods of time. Even though only the sidewalls of the channels of such embodiments bears catalytically active material, the entirety of the fluid is catalytically processed.

The nanoporous, particulate support media can be derived from ingredients comprising one or more particle constituents. To form the particulate support, these particle constituents can be intermixed, aggregated, agglomerated, coalesced, assembled into guest/host structures, and the like. A particularly preferred support is a composite with a guest/host structure that may be prepared by adsorbing or adhering fine particles (as described above) onto relatively larger particles. The relatively fine material in this context is referred to herein as "guest" material, while the relatively larger support material is referred to herein as "host" material. As one alternative, catalytically active gold may be deposited onto the guest material before the guest material is combined with the host material. As another alternative, catalytically active gold may be deposited onto the resultant composite guest/host material during or after the composite material is formed.

This guest/host composite structure provides dramatically higher total exterior surface area while retaining the desirable gas passing characteristics, i.e., low pressure drop, of a coarser particle. In addition, by using nanoporous, smaller particles in constructing these composite particles, inexpensive, non-nanoporous, coarser particles can be used. Thus, very inexpensive, highly active catalyst particles can be prepared since the bulk of the volume of a catalyst bed is taken up by the inexpensive, underlying, coarser particles.

The guest particles may be present in the form of nanoporous aggregates of nanoparticles. These nanoporous aggregate particles may have a median particle size in the range of about 0.2 micrometers to about 3 micrometers, more preferably in the range of about 0.2 micrometers to about 1.5 micrometers, and most preferably in the range of about 0.2 micrometers to about 1.0 micrometers. The guest particles and/or aggregated guest particles provide a nanoporous, exposed, high surface area coating on the host particles for the vapor deposition of gold.

Figure 6:
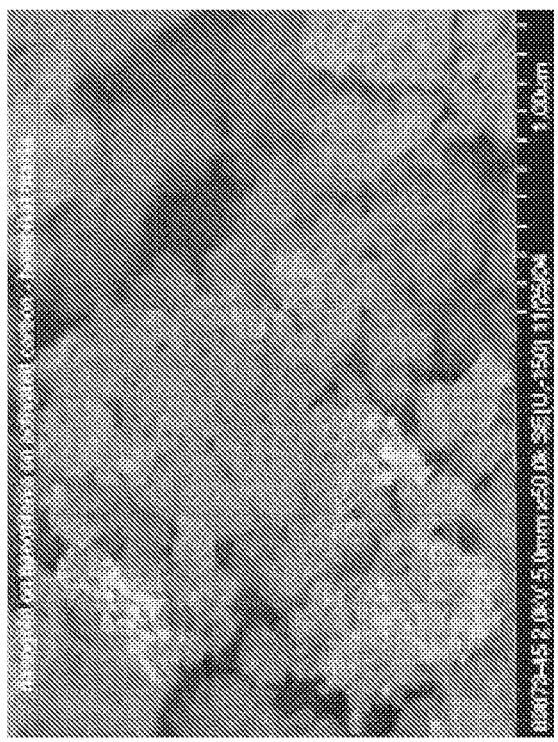
FIG. 6 shows an SEM of a composite particle of the invention in which nanoporous titania particles and aggregates thereof are coated onto carbon host particles.
Figure 5:
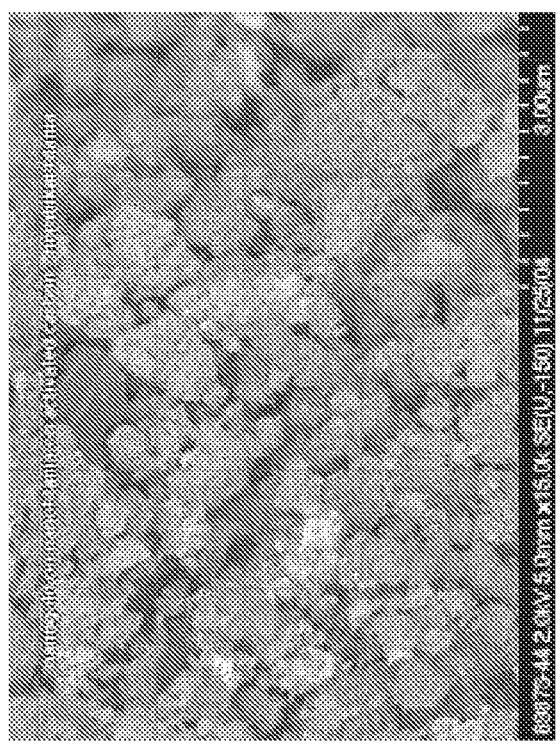
FIG. 5 shows an SEM of a composite particle of the invention in which nanoporous titania particles and aggregates thereof are coated onto carbon host particles.
Figure 7:
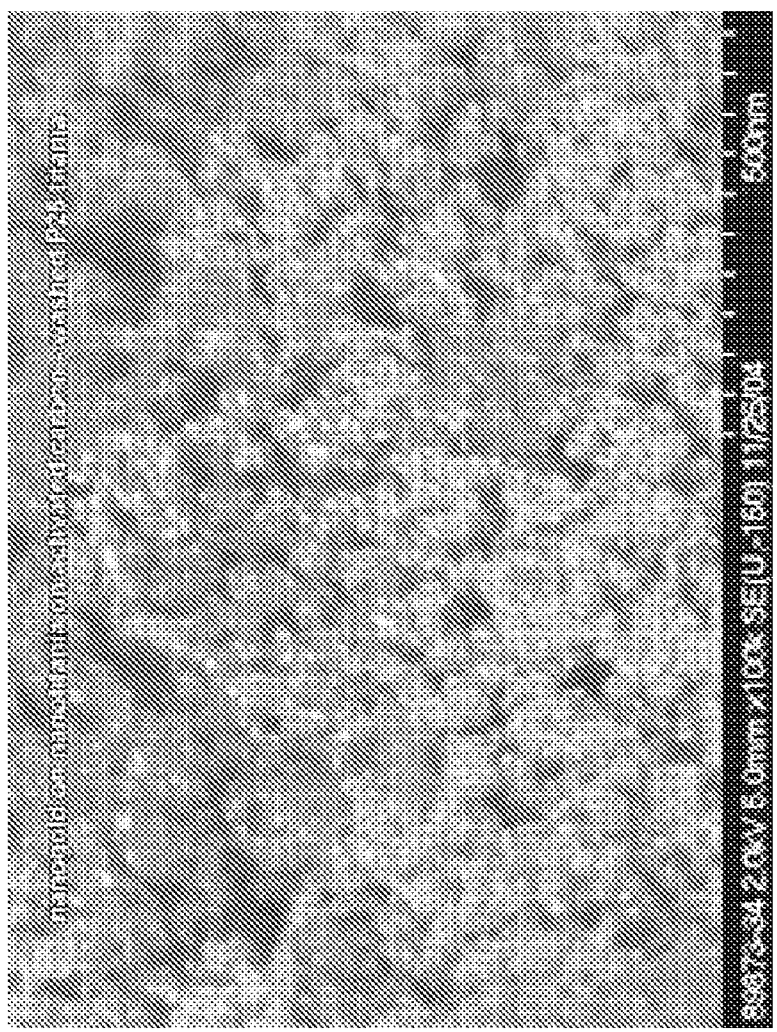
FIG. 7 shows an SEM of a composite catalyst of the invention in which nanoporous titania particles and aggregates thereof are coated onto carbon host particles, wherein gold has been deposited on the titania using PVD techniques.

As shown in FIGS. 5 and 6, the SEM images of guest/host embodiments comprising titania particles and titania aggregates coated as guest material onto carbon host particles show porosity on multiple levels. FIG. 7 shows gold deposited on such particles using PVD techniques to deposit the gold.

In some instances, the guest and/or host material possess nanoporosity, and at least some of this nanoporosity is preserved when the guest/host structure is made. In other instances, the guest and host material may not include substantial amounts of nanoporosity per se. However, the guest material may be coated onto the host material so that the resultant guest coating possesses nanoporosity. For instance, relatively fine, titania nanoparticles may be deposited onto a host particle such as alumina, carbon, or the like. The titania particles might not possess significant nanoporosity. However, by using the principles of the present invention, the titania is coated onto the host in a manner so that the titania coating includes aggregates of titania particles, and clusters of such aggregates, in which the particulate nature of the titania is still at least partially discernible. Even though the titania particles may not possess the desired degree of nanoporosity, the aggregates and/or clusters of aggregates of these particles so possess the desired nanoporosity.

Preferably, the more useful guest particles comprise finer sized nanoparticles that may be present individually, in aggregates, clusters of aggregates, or the like to form the guests. For example, one or more kinds of guest particles are present in nanoparticulate form and independently may have a median particle size in the range of about 3 nm to about 35 nm, more preferably about 3 nm to about 15 nm, and most preferably about 3 nm to about 8 nm. The guest particles preferably have a high surface area as measured by BET. The surface area is preferably greater than about 50 $m^2/g$, more preferably greater than about 150 $m^2/g$. and most preferably greater than about 300 $m^2/g$. Because the aggregates, or clusters of these aggregates, of these guest particles can possess nanoporosity, the individual guest particles may or may not have nanoporosity.

In embodiments in which the host material includes particulate constituents, the one or more kinds of host particles are larger than the guest material being used and typically independently may have a median particle size in the range of 3 micrometers to about 1000 micrometers, more preferably in the range of about 5 micrometers to about 500 micrometers. However, larger host particles may be used in some applications. Within such ranges, it is also desirable that the relative sizes of the host and guest particles are suitable for forming an ordered mixture. Thus, it is preferred that the ratio of the volume average particle size of the host particles to the guest particles is greater than about 3:1, more preferably greater than about 10:1, and more preferably greater than about 20:1. Because the composite will further incorporate guest material in preferred embodiments that may provide the desired degree of nanoporosity, the host material need not be, but can be if desired, nanoporous.

Particle size may be measured in any appropriate manner in accordance with conventional practices now or hereafter practiced. According to one approach, particle size may be determined by inspection of TEM information. Preferably, particle size measurements are made using a laser light diffraction particle size analyzer (such as a Malvern Mastersizer X) using a dry powder feeder module. The measurement from this technique reports a particle size distribution curve, expressed in terms of the volume of equivalent spheres. The numbers reported are diameters of spheres having a volume equivalent to the calculated volume of the particles being measured. The D10, D50, and D90 values, for instance, may be determined from the information embodied in the distribution curve. D10 value refers to the diameter such that 10% of the area of the distribution curve is equal to or smaller than that value. Values for D50 and D90 are determined in an analogous manner for 50% and 90%, respectively. Throughout this specification, a reference to particle size refers to the D50 (average particle size) unless otherwise expressly noted.

A wide variety of particle ingredients may serve as suitable constituents for forming particulate supports in the practice of the present invention. Representative examples include carbonaceous materials, silicaceous materials (such as silica), metal compounds such as metal oxides, combinations of these, and the like. Representative metal oxides include oxides of one or more of magnesium, aluminum, titanium, vanadium, chromium, manganese, cobalt, nickel, copper, zinc, gallium, germanium, strontium, yttrium, zirconium, niobium, molybdenum, technetium, ruthenium, rhodium, palladium, silver, cadmium, indium, iron, tin, antimony, barium, lanthanum, hafnium, thallium, tungsten, rhenium, osmium, iridium, and platinum.

Examples of carbonaceous substances include activated carbon and graphite. Suitable activated carbon particles may be derived from a wide variety of source(s) including coal, coconut, peat, any activated carbon(s) from any source(s), combinations of at least two of these, and/or the like.

Preferred embodiments of support media may be selected from aluminum oxides, titania, titania-alumina, activated carbon, binary oxides such as hopcalite ($CuMn_2O_4$), molecular sieves, and/or the like. Of these, alumina, titania and activated carbon are particularly preferred support materials. Activated carbon, titania and alumina are found in forms having nanoporosity and therefore, these forms are preferred support materials. Activated carbon is advantageous because in addition to providing a support for catalytic activity, the carbon also functions as an adsorbent for noxious gases. Additional impregnants that augment filtering capabilities are also easily incorporated into carbonaceous material in accordance with conventional practices (described further below). Activated alumina also is a preferred support material, as it is very robust to aging and heat. Generally, catalyst systems of the present invention are advantageously made from ingredients comprising an alumina support when the catalyst system will be used at elevated temperature. Otherwise, supports comprising activated carbon are preferred in many embodiments, as these generally have longer service lives.

In those embodiments in which the particulate support has a guest/host structure, a variety of such materials may be used as the host material, either singly or in combination. Preferred host material includes alumina, activated carbon, aluminosilicates, silicates, transition metal oxides, combinations of these and the like. Alumina and activated carbon are preferred.

A preferred embodiment of host particles includes an activated carbon commercially available under the trade designation "Kuraray GG" from Kuraray Chemical Co., Ltd. (Japan). This material contains micropores, mesopores, and macropores as defined by IUPAC. The material contains potassium carbonate but is low in halide content. The material is derived from coconuts.

Guest material of the present invention preferably comprises nanoporous particles or powders that can coat or otherwise become associated with all or a portion of the surfaces of the host material via physical, chemical, electrostatic adhesion, or other means. Representative examples of guest particles include titania (preferably wherein at least a portion of the titania is in the anatase crystalline form); zinc oxide; ceria; iron oxide; alumina; tin oxide, silicon oxide; sol-gel-derived small particles; nanoporous, fine particle size zeolite; high surface area aerogel particles; combinations of these; and the like. Titania is preferred.

A variety of methods generally may be used to construct the composite support media. In one method, nanoporous, guest particles are admixed with one or more adhesion agents in solution and then this mixture is combined with coarser host particles. If the coarser particle is porous, the small particle-adhesion agent solution mixture can be introduced by incipient wetting of the porous larger particle. If the larger particle is not porous, the small particle-adhesion agent solution mixture can be admixed with the coarser particles and the solution liquid can be removed either concurrent with the mixing or subsequent to the mixing. In either case, after combining the nanoporous, small particle size material, the adhesion agent and the coarser particles and removing the liquid from the solution, the mixture is dried and optionally calcined or otherwise heat treated to provide a composite particle having the smaller, nanoporous particles adhered on the surface of a coarser particle. The calcining temperature is selected to be below the temperature at which the nanoporous particles lose porosity. Generally the calcining temperature will be in the range of about 200° C. to about 800° C. In general, a low temperature is preferred. The sample is heated sufficiently to generate a bond between the adhesion agent and the particles but not high enough to significantly alter the nanoporous nature of the coating. The adhesion agent generally is included at an amount of about 0.1 to about 50 parts by weight based upon 100 parts by weight of the guest material. Examples of adhesion agents include basic metal salts, partially hydrolyzed metal complexes such as partially hydrolyzed alkoxides, hydrous metal oxy-hydroxide nanoparticles, and other metal salts. Samples containing carbon, though, generally are heated at more moderate temperatures, e.g., 120° C. to 140° C. As another construction method for making composite support media, guest particles can be adhered to the host particles using partially hydrolyzed alkoxide solutions, basic metal salt solutions, or nanoparticle sized colloidal metal oxides and oxy-hydroxides as an adhesion agent. Partially hydrolyzed alkoxide solutions are prepared as is well known in the sol-gel art. Useful metal alkoxides include alkoxides of titanium, aluminum, silicon, tin, vanadium and admixtures of these alkoxides. Basic metal salts include nitrate and carboxylate salts of titanium and aluminum. Nanoparticle size colloidal materials include colloids of oxides and oxy-hydroxides of aluminum, titanium and oxides of silicon, tin, and vanadium.

As an alternative construction method, guest-host composites can be prepared by physically mixing guest and host materials. This can occur by techniques involving mechanical and/or electrostatic mixing. As a consequence of this mixing, the guest and host components tend to become associated into desired ordered mixtures in which guest material substantially uniformly coats or is otherwise associated with the surfaces of the host material. Optionally, one or more liquid ingredients may be included in the ingredients used to make an ordered mixture, although dry blending with little or no solvent can provide suitable composites. Although not wishing to be bound, it is believed that the guest material may physically, chemically, and/or electrostatically interact with the host material to form the ordered mixture. Ordered mixtures and methods of making such mixtures has been described in Pfeffer et al., "Synthesis of engineered Particulates with Tailored Properties Using Dry Particle Coating", Powder Technology 117 (2001) 40-67; and Hersey, "Ordered Mixing: A New Concept in Powder Mixing Practice", Powder Technology, 11 (1975) 41-44, each of which is incorporated herein by reference.

The present invention provides catalytically active gold on the desired support(s) to form heterogeneous catalytic systems of the present invention. Gold is widely known as a noble, relatively inert metal with a yellowish color. However, the characteristics of gold change dramatically in nanoscale regimes, where gold becomes highly catalytically active. The high reactivity of gold catalyst in comparison with other metal catalysts is illustrated by reactions such as oxidation of CO under ambient conditions and reduction of NO, as well as epoxidation and hydrochlorination of unsaturated hydrocarbons.

In preferred embodiments, catalytically active gold may be identified by one or more requisite characteristics including size, color, and/or electrical characteristics. Generally, if a gold sample has one or more of these requisite characteristics, and preferably two or more of these characteristics, it will be deemed to be catalytically active in the practice of the present invention. Nanoscale size is a key requisite associated with catalytically active gold in that the catalytic activity of gold to a large degree is a function of whether the gold sample has a thickness dimension in the nanoscale regime (e.g., particle diameter, fiber diameter, film thickness, or the like). Bodies (also referred to as clusters in the literature) having smaller dimensions tend to be more catalytically active. As size increases, catalytic characteristics fall off rapidly. Accordingly, preferred embodiments of catalytically active gold may have a nanoscale size over a wide range, with smaller sizes more preferred when higher activity is desired. As general guidelines, catalytically active gold has particle or cluster dimensions in the range of about 0.5 nm to about 50 nm, preferably about 1 nm to about 10 nm. Preferably, the gold has a size of no more than about 2 nm to about 5 nm in any dimension. The technical literature reports that catalytic activity may be a maximum at sizes in the range of about 2 nm to about 3 nm. The size of the individual gold nanoparticles can be determined by TEM analysis as is well known in the art and as is described herein.

In terms of color, gold in larger scale size regimes has a yellowish color. However, in the nanoscale size regimes in which gold is catalytically active, the color of gold becomes a reddish-pink and then purplish-blue when viewed under white light, although very small clusters of gold and gold surface species can be colorless. Such colorless species can be quite catalytic, and the presence of such colorless species is usually accompanied by some colored nanoparticles of gold. Consequently, determining if the color of a gold sample includes a noticeable reddish-pink to purplish-blue component and/or is colorless indicates that it is possible that the sample is catalytically active.

The amount of catalytically active gold provided on a support can vary over a wide range. However, from a practical perspective, it is helpful to consider and balance a number of factors when choosing a desired weight loading. For instance, catalytically active gold is highly active when provided on nanoporous supports in accordance with the practice of the present invention. Thus, only very low weight loadings are needed to achieve good catalytic performance. This is fortunate, because gold is expensive. For economic reasons, therefore, it would be desirable not to use more gold than is reasonably needed to achieve the desired degree of catalytic activity. Additionally, because nanoscale gold is highly mobile when deposited using PVD, catalytic activity may be compromised if too much gold is used due to accumulation of the gold into large bodies. With such factors in mind, and as general guidelines, the weight loading of gold on the support preferably is in the range of 0.005 to 5 weight %, preferably 0.005 to 2 weight %, and most preferably from 0.005 to 1.5 weight % based upon the total weight of the support and the gold. When the support is a composite of 2 or more constituents, e.g., a composite formed by providing a plurality of one or more kinds of guest particles on one or more kinds of host particles, the total weight of the support refers to the total weight of the resultant composite.

Depositing catalytically active gold onto a support is very compatible with PVD techniques. Gold naturally sputters to form catalytically active, nanoscale particles and clusters onto the nanoporous support surface. It is believed that the gold is deposited mainly in elemental form, although other oxidation states may be present. Although gold is mobile and will tend to accumulate in low energy sites of the surface, the nanoporous characteristics of the support and the preferred use of activating agents in the practice of the present invention help to immobilize the gold, helping to keep the deposited gold clusters isolated and preferably discontinuous. This helps to preserve catalytic activity that might be otherwise compromised if the gold were to accumulate into larger sized bodies. As an alternative, very thin, gold films of nanoscale thickness may also be formed over some or all of the support surface if desired, keeping in mind that catalytic activity decreases with increasing film thickness. Even though such films may be formed with catalytic activity, discontinuous, isolated gold clusters tend to be much more catalytically active and are preferred in most applications.

It is also believed that low-coordination gold in catalytic nanoparticles is beneficial. Low coordination gold refers to $Au_n$ for which n on average is in the range of 1 to 100, preferably about 2 to 20. Without wishing to be bound by theory, we propose that the catalytic activity of the very small clusters of gold is associated at least to some degree with low-coordination defects, and that these defects are able to provide sites for storing charges which may be transferred from underlying supports and/or other sources. Accordingly, with such defects and mechanism in mind, it is preferred that heterogeneous catalysts of the invention include one or more of the following features: (a) The gold and hence the defects are located mainly on the surface of the underlying support; (b) The average value for n is greater than about 2; and (c) as much as is practically possible, gold clusters are isolated but nonetheless close to each other (within a distance of about 1 nm to about 2 nm or less). While such features may be associated with smaller sized gold clusters, it is possible that such characteristics may be found mainly at steps or edges of larger clusters.

In addition to gold, one or more other catalysts could also be provided on the same supports and/or on other supports intermixed with the gold-containing supports. Examples include one or more of silver, palladium, platinum, rhodium, ruthenium, osmium, copper, iridium, or the like. If used, these may be co-deposited onto the support from a target source that is the same or different than the gold source target. Alternatively, such catalysts may be provided on the support either before or after the gold. Other catalysts requiring a thermal treatment for activation advantageously may be applied onto the support and heat treated before the gold is deposited. In certain cases catalysts such as Rh, Pd and Pt can be deposited according to the present invention and utilized as catalysts without the presence of gold.

Heterogeneous catalyst systems of the present invention optionally may incorporate one or more activating agents to enhance catalytic performance of the system. As used herein, an activating agent generally refers to any ingredient that is generally not catalytic by itself yet can enhance the performance of a catalyst when both the activating agent(s) and the catalyst are incorporated into the system. In preferred embodiments, the activating agent(s) may be incorporated into the desired support before, during or after gold deposition. Preferably, this incorporation occurs prior to gold deposition. In the case of composite support materials comprising guest material provided on host material, the activating agent(s) may be incorporated into the host material and/or the guest material.

One preferred class of activating agents of the present invention includes one or more metal salts. Water soluble salts such as alkali metal salts and/or alkaline earth metal salts are inexpensive, readily available, and easily incorporated into catalytic systems when practicing the present invention. Significantly, it has been discovered that these salts are potent activators for gold-based catalysis, especially when used to activate nanoporous carbon support media. Bifurcating PVD deposition of catalytically active gold from earlier activation of the support media was a key to help enable this advance in the use of carbon media supports with activating salts for gold-based catalysis.

Clearly, the use of such a metal salt enhances catalytic performance, but the exact mechanism by which performance is enhanced is not known for certain. Without wishing to be bound, it is believed that the metal cation reacts with the surface of the support in a manner that helps to immobilize gold (e.g., by providing a multiphasic surface) and/or that the metal cation functions as an electron acceptor or participates in some fashion in the catalytic reaction sequence. The metal cation may also provide water adsorption sites to provide water to enhance the catalytic reaction.

Examples of metal salts include salts of the alkali or alkaline earth metals such as lithium, potassium, sodium, magnesium, calcium, and/or barium. Other metals include Cs, Rb, and the like. Combinations of any of these metal salts may be used. In some embodiments, the activating agent comprises at least one alkali metal salt and at least one alkaline earth metal salt, wherein the weight ratio of the alkali metal salt to the alkaline earth metal salt is in the range of about 1:19 to about 19:1, preferably about 1:3 to about 3:1.

The metal salts can include any suitable counter anion(s). Examples include nitrate, hydroxide, acetate, carbonate, combinations of these, and the like. Either carbonate or hydroxide is an especially preferred anion as it is safe and convenient to handle and forms very active supports. If the nitrate anion is included, the substrate desirably is calcined to a sufficiently high temperature to decompose the nitrate anion to activate the support. Carbonate is even more effective when used in combination with an alkali metal or alkaline earth metal. Accordingly, preferred activating agents of the invention comprise a carbonate salt, and more preferably an alkali metal carbonate salt or an alkaline earth metal carbonate salt.

Potassium carbonate is very effective, for example, especially when used on activated carbon with a gold catalyst, but it is also effective in systems with other types of supports, e.g., alumina, as well. The fact that potassium carbonate activates a carbon-gold system is quite surprising. Firstly, depositing gold onto $K_2CO_3$ in the absence of the carbon or other nanoporous support provides a system with very low, if any, catalytic activity. Further, depositing gold on activated carbon in the absence of the $K_2CO_3$ also provides a system with very low, if any, catalytic activity. Yet, when the three ingredients are combined, a very effective catalyst system results. Indeed, discovering such a simple and effective way to make activated carbon as a support for catalytically active gold is a significant accomplishment. The benefits of the carbonate are highlighted by data showing that potassium sulfate is a poor activating agent, although it is believed that its performance would improve if a support impregnated with potassium sulfate were to be thermally treated prior to gold deposition.

Yet, potassium carbonate and many of the other salts mentioned herein are very soluble in aqueous solution. Depositing the gold onto the substrate via PVD allows systems containing both gold and such activating materials to be easily made. Water soluble activators such as $K_2CO_3$ cannot be used with conventional aqueous impregnation or precipitation methods. This is because they would dissolve in and be washed from the support medium by the water solvents.

Another advantageous class of activating agents includes alkoxide materials, especially those described above with respect to forming nanoporous surface features on less porous host particles. Preferred alkoxides include alkoxides of Ti and Al. Alkoxide materials are advantageously used in combination with one or more of the water soluble salt materials described above. When the two kinds of materials are used together, they can be impregnated onto the support at the same time or sequentially in any order, although it is preferred that the alkoxide material(s) be impregnated onto the support after the impregnation of the salt(s). In a representative process, the water soluble salt is impregnated onto the support, and the support is then dried and optionally calcined. Next, the alkoxide is impregnated onto the guest particle, the product is hydrolyzed, dried, and optionally calcined. Thus, prepared, gold is then deposited onto the activated support.

Use of an alkoxide as an impregnant/activating agent appears to change the crystalline structure of the support in our TEM studies. Specifically, the grain structure of the support proximal to the support surface appears to be much finer than the core region and much finer than otherwise identical systems prepared without the alkoxide. The structure modification penetrates in most instances further into the support than the gold, e.g., 50 nm or more. In some instances, the boundary between the modified surface region and the unmodified core region is easily observed.

Not all alkoxides may work in all conditions. For example, Ti and Al alkoxides were found to enhance catalytic performance when incorporated into catalyst systems as shown in the examples. However, substituting a Zr-based alkoxide into these formulations did not demonstrate any enhancement in the ability of the system to oxidize CO.

In a similar fashion, some water soluble salt activating agents, particularly sulfates, oxalates, and phosphates, did not demonstrate activating performance in some of our studies, although it is believed that calcining the impregnated support could improve performance of at least the sulfates and oxalates. While not wishing to be bound, it is believed that these kinds of anions, which tend to be coordinating, impact support surface charges in a manner that impairs the ability of the surface to immobilize gold. Yet, sulfate and oxalate anions are readily decomposed at reasonable calcining temperatures, which explains why we believe that calcining would enhance the activating characteristics of these materials.

Likewise, not all porous supports are readily activated under the same conditions that work with other support media. For instance, certain zeolites, e.g., sodium Y zeolites form poor support media when processed in ways that are effective for alumina, carbon, silica, hopcalite, etc. Even when activated with a salt, low or no catalytic activity for CO oxidation was observed when procedures that worked for alumina were applied to zeolite media. Zeolites are known to have more ordered structures and to not possess the defects of other oxides. Silicalite, the aluminum-free form of ZSM-5-type zeolite, was found to work well in the present invention. Thus, for certain zeolite materials to be used as support media, they are preferably surface treated in some fashion to enhance the ability of the surface to immobilize gold.

The amount of activating agent used in the heterogeneous catalyst system can vary over a wide range and will depend upon a variety of factors including the nature of the activating agent, the amount of gold to be incorporated into the system, the nature of the support, and the like. Generally, if too little activating agent is used, the potential benefits of using the activating agent may not be fully attained. On the other hand, beyond some point, using additional activating agent may not provide significant additional benefit and may undermine catalytic performance to some degree. Accordingly, as suggested guidelines, representative embodiments of the invention may include from 0.25 to 15, preferably 1 to 5 weight percent of activating agent based upon the total weight of activating agent and the support. When one or more water soluble salts and one or more alkoxide materials are used in combination, the molar ratio of the salt(s) to alkoxide(s) ingredient(s) is in the range of 1:100 to 100:1, preferably 1:5 to 5:1.

The activating agent may be incorporated into the heterogeneous catalyst system in a variety of different ways. In some instances, the support to be used may inherently include a suitable activating agent. For example, activated carbon derived from coconut shell naturally includes potassium carbonate as a constituent. This kind of activated carbon provides an excellent support for gold catalyst without requiring additional activating ingredients.

We have demonstrated the benefit of using activated carbon from coconut husk as well as the benefit of using potassium carbonate as an activating agent. Kuraray GC carbon and Kuraray GG carbon are both derived from coconut shells. Kuraray GG carbon is the natural, resultant carbon that includes potassium carbonate. Kuraray GC carbon is similar except that it has been acid washed and then extensively rinsed with water to remove the potassium carbonate and other acid and water soluble constituents. When gold is deposited onto these two carbons using PVD, the system derived from Kuraray GG carbon (includes the potassium carbonate) is a very good catalyst for CO oxidation, especially under more humid conditions. On the other hand, the system derived from Kuraray GC carbon (essentially no potassium carbonate) has low activity for CO oxidation in dry or humid environments. Further, if the Kuraray GG carbon is washed to remove the potassium salt, catalytic functionality of the resultant system is significantly compromised. Catalytic activity can be recovered again if the washed Kuraray GG carbon is impregnated with an activating agent prior to gold deposition, especially if the impregnated carbon is thermally treated (described further below) prior to gold deposition.

TEM (transmission electron micrograph) examination of the gold deposited on Kuraray GG carbon particles by physical vapor deposition showed the presence of nanoparticles and protodots (protodots being the very small clusters of gold) both on the immediate surface of the support and in pores immediately adjacent to the support surface. As could be seen in the transmission electron micrograph, the gold was present in both nanoparticle and in very small cluster forms. The gold particles formed preferentially in small grooves and fissure-like pores in the carbon as evidenced by the orientation of the gold particles in linear, necklace-like patterns on the surface of the carbon. The dark field image of the same region showed the gold-enriched striations clearly. The uniformity of the gold deposition could be clearly seen on the TEM images. The gold clusters that were observed by TEM were as small as 1 nm or less and as large as about 5 nm. The gold rich grooves or striations were as wide as about 7 nm and as long as about 50 to 100 nm. There were also gold-rich domains comprising exceedingly fine gold arrays that appear as veil-like bright regions in the dark field image. It is unknown why these regions, although quite crystalline in character, did not coalesce into single crystals of gold.

Although not wishing to be bound by theory, a possible explanation for the performance of potassium carbonate is that potassium carbonate provides sites where water can adsorb. Indeed, in certain cases we have found that the gold catalysts are more active in the presence of moisture.

Unlike Kuraray GG carbon, many other desirable supports do not naturally include an activating agent. Consequently, in some instances, it may be desirable to incorporate an activating agent comprising one or more constituents into the desired support. Such incorporation can occur in any desired manner. Incipient wetness impregnation is one suitable technique, and examples of using solution impregnation are described in the examples below. Briefly, incipient wetness impregnation involves slowly adding a solution comprising the desired activating agent to dry support particles with mixing. The solution generally is added until saturation, and adding an excess of solution is desirably avoided. Such solutions typically are aqueous and the concentration of each species of activating agent in the solution generally is in the range of about 0.2 M to about 1.0 M. If more than one species of activating agent is to be added, these may be added together, separately, or in overlapping fashion. After impregnation, the particles are dried and optionally calcined (thermal treatment).

In any embodiments of the invention, the catalyst system may further incorporate one or more agents to enhance the filtering capabilities of the system. In many embodiments, such agents are in the form of one or more impregnants that may be incorporated into the nanoporous support medium. In those embodiments wherein the nanoporous support medium has a guest/host composite structure, such impregnants may be incorporated in the guest and/or host material. Most preferably, particularly when the host comprises a carbonaceous material such as activated carbon particles, the impregnants are incorporated at least into the carbonaceous material.

Examples of impregnants include one or more metals, metal alloys, intermetallic compositions, and/or compounds containing one or more of Cu, Zn, Mo, Cr, Ag, Ni, V, W, Co, combinations thereof, and the like. However, because the hexavalent form of Cr has been identified as a potential carcinogen, the catalyst system of the present invention preferably includes no detectable amounts of Cr (VI), and more preferably no detectable Cr of any valence state due to the risk that other forms of Cr, e.g., Cr(IV) could be oxidized to Cr(VI). The metals typically are impregnated as salts and can be converted to other forms, e.g., oxides perhaps, during some modes of impregnation.

The selection of which one or more transition metal compounds to incorporate into the catalyst system depends upon the desired range of filtering capabilities inasmuch as each of the various transition metals tend to provide protection against particular air contaminants. For example, Cr, Mo, V, or W independently helps to filter gases such as cyanogen chloride and hydrogen cyanide from air streams when used in combination with a Cu impregnant. Representative catalyst system particles may include 0.1 to 10 weight percent of one or more impregnants including Mo, V, W, and/or Cr. Due to the potential toxicity of Cr, the use of Mo, V, and/or W materials is preferred. Throughout this specification and accompanying claims, weight percent with respect to impregnants is based upon the total weight of the impregnated particles unless otherwise noted.

Cu tends to help filter many gases such as HCN, $H_2S$, acid gases, and the like from air streams. Representative filter media particles may include 0.1 to 15 weight percent of one or more impregnants including Cu.

Zn in various forms tends to help filter HCN, cyanogen chloride, cyanogen, and $NH_3$ from air streams. Representative filter media particles of the present invention may include 1 to 20 weight percent of one or more impregnants including Zn.

Ag tends to help filter arsenical gases from an air stream. Ag functions catalytically and generally is not consumed during filtering operations. Accordingly, filter media particles may include relatively small catalytic amounts, e.g., about 0.01 to 1, preferably 0.1 weight percent, of one or more Ag-containing impregnants.

Ni and Co each independently helps to filter HCN from air streams. Representative filter media particles may include 0.1 to 15 weight percent of one or more Ni containing impregnants and/or Co containing impregnants.

In addition to one or more impregnants that contain transition metals, the first plurality of substrate particles may optionally include one or more other kinds of impregnants. For example, ammonia or ammonium salts in the impregnating solution not only help to improve the solubility of transition metal compounds during the manufacture of the particles, but remaining adsorbed quantities also help to remove acid gases from air streams. Sulfate salts are believed to help to control the pH during usage of filter media. Ammonium sulfate, for instance, when impregnated on a substrate such as carbon and dried at 145° C. forms an acid sulfate. Acid sulfate is sufficiently acidic to react with ammonia to facilitate removal of ammonia from a flow of air or other gas. Through impregnation and drying, strongly acidic ammonium salts impregnate the carbon during the drying process without damaging the basic oxide/hydroxide impregnant being formed. This results in enhanced ammonia service life of a cartridge containing the resultant impregnated carbon. Representative filter media particles may include 0.1 to 10, preferably 2.5 to 4.5 weight percent of sulfate.

Moisture beneficially helps to remove acid gases from air streams. Optionally, therefore, the first plurality of filter media particles may include up to about 15 weight percent, preferably about 6 to 12 weight percent of water.

Impregnants may be incorporated into the catalyst system in accordance with conventional practices. Such impregnants are typically provided as salts, oxides, carbonates, or the like and are impregnated via solution processing, sublimation processing, fluidized bed processing, and the like. Preferably, such impregnation occurs prior to gold deposition. Representative techniques for such processing have been widely described in the literature, including the patent and literature documents cited in the Background section herein.

Deposition of gold preferably occurs via PVD after impregnation of other materials, coating of host material or structures with at least one guest material (with respect to host/guest composite structures when used), drying, and optional calcining Bifurcation of impregnation and gold deposition is a distinct advantage for many reasons. First, if the gold were to be added to the particles via solution impregnation, the kinds of activating agents that could be used would be limited. For instance, $HAuCl_4$, a gold species commonly used in solution methods because of its relatively low cost, is very acidic making it incompatible with basic activating agents such as the preferred alkali and alkaline earth metal salts. In cases where basic gold species are used, the aqueous impregnation would tend to wash away some of the desired activating ions. Thus, subsequent deposition of gold via PVD (a non-solution process) separate from impregnation with activating agents is a significant process feature that allows gold to be substantially more easily used in combination with these extremely effective activating agents. As an additional advantage, this method allows gold to be deposited onto the support with the activating agent already in place. We think this is one reason why gold deposited in accordance with our invention is so active as deposited without requiring a subsequent thermal treatment.

Thermal treatment (calcining) of the activated support prior to gold deposition, however, can be very beneficial. In some instances, an activating agent may not function to the desired degree until after calcining. For example, calcining tends to yield demonstrable improvements when the activating agent includes a nitrate salt. In other instances, the performance of an effective activating agent would be further enhanced. For example, the performance of generally effective carbonate salts can be enhanced to a degree via calcining. Yet, salts such as potassium carbonate tend to already be in active form when impregnated, and the resultant activated supports are beneficially dried, e.g., at a temperature up to about 200° C. without really needing a calcining treatment.

In general, thermal treatment involves heating the impregnated support at a temperature in the range of about 125° C. to about 1000° C. for a time period in the range of 1 second to 40 hours, preferably 1 minute to 6 hours, in any suitable atmosphere, such as air; an inert atmosphere such as nitrogen; carbon dioxide; argon; or a reducing atmosphere such as hydrogen; and the like. The particular thermal conditions to be used will depend upon factors including the nature of the support and the nature of the impregnant(s). Generally, thermal treatment should occur below a temperature at which the constituents of the impregnated support would be decomposed, degraded, or otherwise unduly thermally damaged. Calcining treatments of impregnated supports are described in the examples below.

Physical vapor deposition refers to the physical transfer of gold from a gold-containing source or target to the support. Physical vapor deposition may be viewed as involving atom-by-atom deposition although in actual practice, the gold may be transferred as extremely fine bodies constituting more than one atom per body. Once at the surface, the gold may interact with the surface physically, chemically, ionically, and/or otherwise. Using physical vapor deposition methodologies to deposit nanoscale gold on activating, nanoporous support media makes the synthesis of catalytically active gold dramatically easier and opens the door to significant improvements associated with developing, making, and using gold-based, catalytic systems.

Some modes of practice, particularly those using lower amounts of deposited gold, involve depositing gold via PVD only after the support media has been impregnated with one or more activating agents and/or other impregnant(s), dried, and optionally calcined or otherwise heat treated. This greatly expands the range of activating agents that can be used in combination with a catalytically active metal. We can use ingredients that would otherwise react or be too soluble in solution when wet methods are used to deposit gold. For instance, the process of the invention can deposit gold or other metals onto media comprising very basic or water-soluble materials. This has opened the door to testing and using water soluble, metal salts as activating agents inasmuch as these are not washed away when gold is subsequently deposited via PVD. It would not be very practical to attempt to use such salts as activating agents when gold is impregnated onto the support media via solution processing, inasmuch as the gold solutions could wash away the water soluble material and/or be chemically incompatible with the activating agents (e.g., gold solutions tend to be strongly acidic, e.g., $HAuCl_4$).

We have observed that a catalytically active metal such as gold is active right away when deposited via PVD. There is no need to heat treat the system after gold deposition as is the case with some other methodologies, although such heat treating may be practiced if desired. Additionally, the gold is highly active catalytically for relatively long periods with respect to CO oxidation, even though it tends to be deposited only proximal to the support media surface when using PVD to deposit the gold. The catalyst systems also are effective in humid environments and work over a wide temperature range, including room temperature (e.g., about 22° C. to about 27° C.) and much cooler (e.g., less than 5° C.).

The physical vapor deposition process is very clean in the sense that there are no impurities introduced into the system as in the case of the solution state processes. In particular, the process may be chloride-free and thus there is no need for washing steps to remove chloride or other undesirable ions, molecules or reaction by-products, as is the case in most solution state deposition processes.

By using this process, very low levels of metal are required for high activity. While most research in this area uses at least 1% by weight gold to achieve activity, and often times much more than 1 weight % gold to achieve high activity, in this work we have achieved very high activity at 0.15% by weight gold or lower. This reduction in the amount of precious metal required for high activity provides a very substantial cost savings. Yet, other embodiments of the present invention, such as guest/host composite systems, provide high performance using higher levels of gold, e.g., 0.5% to 5% by weight gold.

This process results in a very uniform product with respect to precious metal concentration per particle and metal nanoparticle size and size distribution. TEM studies have shown that our process can deposit gold in a form including discrete nanoparticles and small clusters or in a more continuous thin film depending on what is desired. In general, it is desired to include gold in nanoparticle/small gold cluster form.

This catalyst preparation method can deposit catalyst metals uniformly on non-uniform or non-homogeneous surfaces. This is not true for the solution state deposition processes that tend to favor deposition on the surfaces having a charge opposite to the depositing metal ion, leaving the other surfaces uncoated or at best weakly coated.

In addition to gold, the PVD process can be used to deposit other metals simultaneously or sequentially or to deposit mixtures of metals by using poly-phasic targets so that catalyst particles can be formed that comprise polyphasic nanoparticles, e.g., nanoparticles comprising atomic mixtures of say $M_1$ and $M_2$ (where $M_1$ and $M_2$ represent different metals), or that have combinations of metal nanoparticles for multi-function catalysts, e.g., nanoparticle mixtures comprising mixtures of discrete $M_1$ particles and discrete $M_2$ particles. In this fashion, catalyst particles can be prepared that can catalyze more than one reaction and these functions can be carried out simultaneously in practice. Thus, for instance, a catalyst particle can be prepared that will oxidize CO while at the same time oxidize $SO_2$ efficiently.

The PVD approach can efficiently deposit catalytically active metals on a wider range of support media, e.g., not only particles but also honeycombs, fibers, scrims, fabrics, paper, and the like. While fibers can be coated in the solution coating processes, the shear used to pulp and disperse the fibers in those processes generally results in dust formation and in inefficient coating due to the abrasion of the fibers during the coating process. PVD techniques are much more facile in this regard.

This PVD process allows catalytically active gold to be easily deposited onto supports containing carbon as well as on other oxidatively sensitive substrates. In the processes known in the art that require a heating step to affix and activate the catalyst particles, carbon in the presence of an oxidizing environment cannot adequately withstand the elevated temperatures that are often used. Thus, the carbon particles had to be treated in a reducing atmosphere since they would be attacked by oxygen during this heating step. Such a reducing step may undesirably reduce other catalyst constituents (e.g., as in the case of iron oxide supported on carbon or in porous carbon). In the instant invention, carbon particles and other non-oxide particles can be coated with catalyst nanoparticles and no heating step or post reduction is required. In this manner, high surface area carbon can be rendered catalytic for CO oxidation without losing the adsorptive properties of the porous carbon for the removal of other impurities from a gas stream.

The PVD approach can be used to coat very fine particles with catalyst wherein the fines are already coated on a larger host material. Alternatively, the PVD approach can be used to coat catalyst onto very fine particles before the fine particles are coated onto a second granular phase or other host or are thereafter formed into a porous granule. With either approach, the resultant composite provides high CO oxidation activity with low backpressure during use.

Physical vapor deposition preferably occurs under temperature and vacuum conditions in which the gold is very mobile. Consequently, the gold will tend to migrate on the surface of the substrate until immobilized in some fashion, e.g., by adhering to a site on or very near the support surface. It is believed that sites of adhering can include defects such as surface vacancies, structural discontinuities such as steps and dislocations, interfacial boundaries between phases or crystals or other gold species such as small gold clusters. It is a distinct advantage of the invention that the deposited gold is immobilized effectively in a manner in which the gold retains a high level of catalytic activity. This is contrasted to those conventional methodologies in which the gold accumulates into such large bodies that catalytic activity is unduly compromised or even lost.

There are different approaches for carrying out physical vapor deposition. Representative approaches include sputter deposition, evaporation, and cathodic arc deposition. Any of these or other PVD approaches may be used, although the nature of the PVD technique used can impact catalytic activity. For instance, the energy of the physical vapor deposition technique used can impact the mobility, and hence tendency to accumulate, of the deposited gold. Higher energy tends to correspond to an increased tendency of the gold to accumulate. Increased accumulation, in turn, tends to reduce catalytic activity. Generally, the energy of the depositing species is lowest for evaporation, higher for sputter deposition (which may include some ion content in which a small fraction of the impinging metal species are ionized), and highest for cathodic arc (which may be several tens of percents of ion content). Accordingly, if a particular PVD technique yields deposited gold that is more mobile than might be desired, it may be useful to use a PVD technique of lesser energy instead.

Physical vapor deposition generally is a line of sight/surface coating technique between the gold source and the support. This means that only the exposed, outer surfaces of the support, but not the inner pores well within the substrate, are directly coated. Inner surfaces not in a direct line of sight with the source will tend not to be directly coated with gold. However, we have found by TEM analysis that after deposition on the surface of a porous substrate, the gold atoms can migrate by diffusion or other mechanism some moderate distance into the catalyst surface to provide nano-particles and gold clusters in the substrate pores in the region immediately adjacent to the surface before being immobilized. The average penetration into the porous substrates can be up to 50 nanometers in depth or sometimes greater, such as up to about 70 to about 90 nm in depth. In general though, the penetration depth is less than 50 nm and can be less than 30 nm. The gold penetration is very shallow compared to the typical support size.

The total thickness of the gold, or $C_t$, is equal to the gold penetration depth plus the thickness of the gold that is deposited on the surface of the substrate and that has not penetrated by diffusion. This total thickness is in general less than 50 nm and can often be less than 30 nm or even less than 20 nm. On materials having surface pores whose depth is greater than about 10 nm to 20 nm, the total gold thickness can appear to be greater than 50 nm since the gold layer follows the contours of the surface and the actual surface contour is reflected by the pore structure that it possesses. It is most preferred that the active gold species be collected on the outermost portion of the catalyst particle since this is the surface of the catalyst that interacts most readily with gaseous reactants.

The thickness of the gold shell region relative to the catalyst support particle size is quantified by the formula $$PDR=C_t/UST$$

wherein PDR is the penetration depth ratio, UST is the underlying support thickness or particle size and $C_t$ is the total thickness of the gold, as defined above. The underlying support thickness represents the size of the support as measured perpendicular to the catalyst surface and is usually indicative of particle size. The underlying support thickness may be determined by microscopic methods including optical microscopy or scanning electron microscopy. The value for $C_t$ may be determined by transmission electron microscopy in the case of thin films and high resolution scanning electron microscopy in the case of thicker films. The total thickness $C_t$ is very easily discerned from visual inspection of TEM data. Because of the uniformity by which gold is coated, a single representative TEM picture can be effective to characterize the coating. In practice, a sample may be effectively characterized via examination of a number of TEM pictures of catalyst surface cross-sections (vida infra) In preferred embodiments, PDR is in the range of about $1\times10^{-9}$ to 0.1, preferably $1\times10^{-6}$ to $1\times10^{-4}$, indicating that the gold shell region is very thin indeed relative to total support thickness. As noted above, this generally corresponds to a penetration depth on the order of up to about 50 nm, preferably about 30 nm on preferred supports.

Characterization of the surface region and the gold bodies is accomplished using transmission electron microscopy as is well-known in the catalyst art. One method suitable for characterizing the catalytic surfaces is as follows: the catalyst particles are embedded in 3M Scotchcast™ Electrical Resin #5 (epoxy; 3M Company, St. Paul, Minn.) in disposable embedding capsules; resin is allowed to cure at room temperature for 24 hours.

For each sample, a random, embedded granule is trimmed (with a stainless steel razor blade previously cleaned with isopropyl alcohol) down to the middle surface region of the granule such that most of the granule is cut away on one side, leaving epoxy on the other side. A small trapezoid-shaped face (less than a half millimeter on a side) is selected and trimmed such that the epoxy/granule interface is left intact. The long direction of this interface is also the cutting direction. A Leica Ultracut UCT microtome (Leica Microsystems Inc., Bannockburn, Ill.) is used to cross-section the face. The face is first aligned such that the granule surface was perpendicular to the knife edge. Sections approximately 70 nm thick are cut at a speed of 0.08 mm/second. These sections are separated by floating onto deionized water and collected using a microtomy hair tool and picked up using a "Perfect Loop" (loop distributed by Electron Microscopy Sciences, Fort Washington, Pa.). Samples are transferred via this loop to a 3 mm diameter, 300 mesh copper TEM grid with carbon/formvar lacey substrate. The regions of interest (intact, cleanly cut specimens showing the interfacial region) that lie over the holes in the substrate are imaged and analyzed.

Images are taken at various magnifications (50,000× and 100,000×) in a Hitachi H-9000 transmission electron microscope (TEM; Hitachi High Technologies America, Pleasanton, Calif.) at 300 KV accelerating voltage using a Gatan CCD camera (Gatan Inc., Warrenton, Pa.) and Digital Micrograph software. Representative regions (regions selected wherein the interface of the catalytic surface is clearly displayed in a fashion perpendicular to the surface of the sample) are imaged. Calibrated markers and sample identifications are placed on each image. Numerous (>10) interfacial regions are examined.

An example of a TEM image of a cross-section of a representative catalyst surface of the present invention (material of example 3 of Assignee's Co-Pending Application cited above) is shown in FIG. 1. The gold nanoparticles can be seen to be both on the surface of the support and in the sub-surface region of the support. The region containing the gold nanoparticles is very thin and the gold deposition can be seen to follow the contours of the surface of the support.

As a consequence of line of sight coating, the resultant catalytically active material of the invention from one perspective may be viewed as nanoporous catalytic supports having relatively thin shells of discontinuous, catalytic gold on and proximal to their outer surfaces. That is, a resultant catalytically active material comprises a gold-rich shell region proximal to the surface and an interior region comprising negligible gold. In preferred embodiments, this gold-rich shell region comprises small (generally less than 10 nm, most preferably less than 5 nm), discrete gold bodies.

The inventive approach of forming a catalytically active shell region only on the surface of a nanoporous support is contrary to conventional wisdom when developing new catalytic material, and, therefore, the fact that the resultant material is so catalytically active is quite surprising. Specifically, the present invention puts catalytic functionality only near the surface of a highly porous support. Interior porosity is purposely unused. From a conventional perspective, it seems pointless to underutilize a nanoporous support in this manner. Knowing that catalytically active metal is to be deposited only at the support surface, the conventional bias might have been to use a nonporous substrate when depositing catalytically active gold onto a support. This is especially the case when PVD is not able to access the interior of the porous support in any event. The present invention overcomes this bias through the combined appreciation that (1) gold mobility is highly restricted on the surface of nanoporous supports, and (2) gold is still catalytically active even at very low weight loadings resulting from the surface coating approach. Consequently, using such supports is highly and uniquely beneficial in the context of depositing gold onto the surface region of a nanoporous support even though full catalytic capacity of the support is not utilized. For this reason, catalytically active gold is readily formed on composite supports (described further below) in which nanoporous "guest" particles are deposited onto "host" material, which itself may or may not be nanoporous.

Generally, physical vapor deposition preferably is performed while the support to be treated is being well-mixed (e.g., tumbled, fluidized, or the like) to help ensure that particle surfaces are adequately treated. Methods of tumbling particles for deposition by PVD are summarized in U.S. Pat. No. 4,618,525. For methods specifically directed at catalysts see Wise: "High Dispersion Platinum Catalyst by RF Sputtering," Journal of Catalysis, Vol. 83, pages 477-479 (1983) and Cairns et al U.S. Pat. No. 4,046,712. More preferably, the support is both tumbled or otherwise fluidized as well as comminuted (e.g., ground or milled to some degree) during at least a portion of the PVD process. This provides a degree of mechanical abrasion of the surface of the particles and generation of some fines during gold deposition. Our data suggests that catalytic performance is enhanced when deposition is carried out with comminution. It is our belief that these processes, i.e., the generation of fines and the mechanical interaction of the grits with each other, increases the activity of the resulting catalyst materials. While not wishing to be bound by theory, we believe that the fines provide higher surface area for higher activity. Fresh surface areas of the support are also exposed, and this might also enhance performance.

The impact of such comminution upon the resultant surface characteristics of the catalyst system was studied via TEM analysis. In the case of the gold on carbon containing the activating agents of the present invention, the TEMs reveal the presence of a unique, two phase structure believed to comprise nanoparticles and clusters of gold and carbonaceous material on the surface of the gold-coated particles. This nano-composite of gold/activation agent and carbon seems to possess a very high activity for catalysis of CO oxidation.

Such comminution, however, may not be desired in those embodiments in which gold is deposited onto composite supports fabricated from ingredients comprising guest and host material. Grinding tends to reduce the activity of these composite-based catalyst systems. In the case of composite structures containing titania guest material coated onto carbon host material, and without wishing to be bound, the reduced activity may be due to fines of carbon being generated and deposited on the titania. This tends to reduce the amount of gold/titania interfaces associated with higher activity.

An apparatus 10 for carrying out the preferred PVD process is shown in FIGS. 2 and 3. The apparatus 10 includes a housing 12 defining a vacuum chamber 14 containing a particle agitator 16. The housing 12, which may be made from an aluminum alloy if desired, is a vertically oriented hollow cylinder (45 cm high and 50 cm in diameter). The base 18 contains a port 20 for a high vacuum gate valve 22 followed by a six-inch diffusion pump 24 as well as a support 26 for the particle agitator 16. The chamber 14 is capable of being evacuated to background pressures in the range of $10^{-6}$ torr.

The top of the housing 12 includes a demountable, rubber L-gasket sealed plate 28 that is fitted with an external mount three-inch diameter dc magnetron sputter deposition source 30 (a US Gun II, US, INC., San Jose, Calif.). Into the source 30 is fastened a gold sputter target 32 (7.6 cm (3.0 inch) diameter×0.48 cm (3/16 inch) thick). The sputter source 30 is powered by an MDX-10 Magnetron Drive (Advanced Energy Industries, Inc, Fort Collins, Colo.) fitted with an arc suppressing Sparc-le 20 (Advanced Energy Industries, Inc, Fort Collins, Colo.).

The particle agitator 16 is a hollow cylinder (12 cm long× 9.5 cm diameter horizontal) with a rectangular opening 34 (6.5 cm×7.5 cm) in the top 36. The opening 34 is positioned 7 cm directly below the surface 36 of the gold sputter target 32 so that sputtered gold atoms can enter the agitator volume 38. The agitator 16 is fitted with a shaft 40 aligned with its axis. The shaft 40 has a rectangular cross section (1 cm×1 cm) to which are bolted four rectangular blades 42 which form an agitation mechanism or paddle wheel for the support particles being tumbled. The blades 42 each contain two holes 44 (2 cm diameter) to promote communication between the particle volumes contained in each of the four quadrants formed by the blades 42 and agitator cylinder 16. The dimensions of the blades 42 are selected to give side and end gap distances of either 2.7 mm or 1.7 mm with the agitator walls 48. Preferred modes of use of this apparatus are described below in the examples.

Physical vapor deposition may be carried out at any desired temperature(s) over a very wide range. However, the deposited gold may be more catalytically active if the gold is deposited at relatively low temperatures, e.g., at a temperature below about 150° C., preferably below about 50° C., more preferably at ambient temperature (e.g., about 20° C. to about 27° C.) or less. Operating under ambient conditions is preferred as being effective and economical since no heating or chilling requirements are involved during the deposition.

While not wishing to be bound by theory, it is believed that the deposition at lower temperatures yields more catalytically active gold for at least two reasons. First, lower temperatures yield gold with more defects in terms of geometrical size and/or shape (angularities, kinks, steps, etc.). Such defects are believed to play a role in many catalytic processes (see Z. P. Liu and P. Hu, *J. Am. Chem. Soc.*, 2003, 125, 1958). On the other hand, deposition at higher temperatures tends to yield gold that has a more organized and defect-free crystal structure and hence is less active. Additionally, deposition temperature can also impact gold mobility. Gold tends to be more mobile at higher temperatures and hence more likely to accumulate and lose catalytic activity.

Optionally, the heterogeneous catalyst system may be thermally treated after gold deposition if desired. Some conventional methods may require such thermal treatment in order to render the gold catalytically active. However, gold deposited in accordance with the present invention is highly active as deposited without any need for a thermal treatment. Indeed, such gold can very effectively catalytically oxidize CO to form $CO_2$ at room temperature or even much cooler. Additionally, depending upon factors such as the nature of the support, the activating agents, the amount of gold, or the like, catalytic activity can be compromised to some degree if thermally treated at too high a temperature. Indeed, for some modes of practice in which the heterogeneous catalyst system is intended to be used in a heated environment, e.g., an environment having a temperature higher than about 200° C., the catalytic activity of the system should be confirmed at those temperatures.

In a conventional approach, catalyst particles are packed into a bed through which a fluid is transported for catalytic processing. The packed bed typically occupies a suitable depth and the full cross-section of the vessel containing the packed bed. Conventional thought is that transport through such a packed bed helps to assure that all of the fluid intimately contacts the catalytic surfaces. The present invention uses a different paradigm. Instead of being present in a packed bed, the catalytic particles of the present invention at least partially coat, and more preferably substantially coat, the conduit walls defining a through-channel through which the fluid is transported. The walls carry a charge to facilitate adherence of the particles to the wall surface. Typically, the charge is an electrostatic or electret charge. In essence, the conduit defines an unobstructed channel whose boundary surfaces are catalytically active. Surprisingly, even though only the conduit surfaces are catalytically active, our tests have shown that substantially the full volume of fluid transported through the conduit is catalytically processed.

Figure 14:
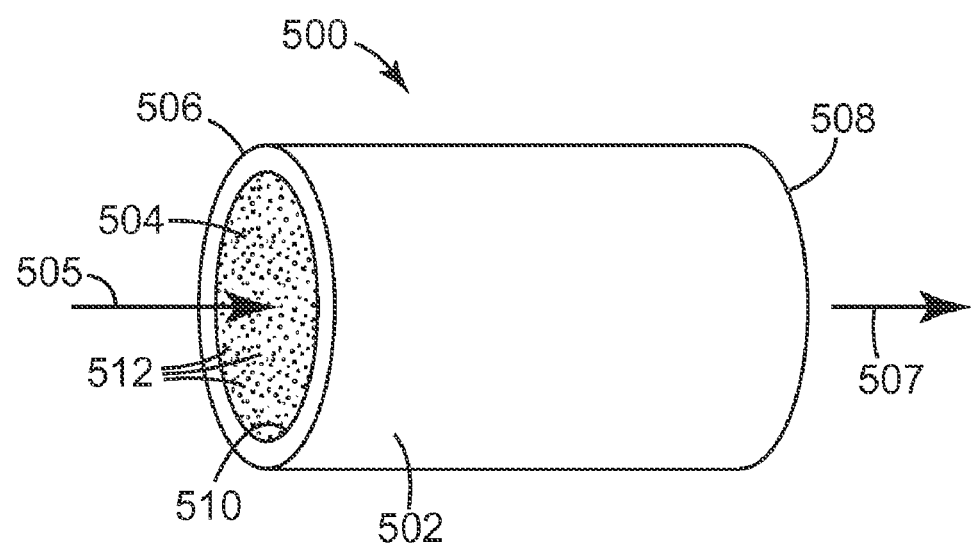
FIG. 14 schematically illustrates an embodiment of a catalytically active conduit system of the present invention.
Figure 15:
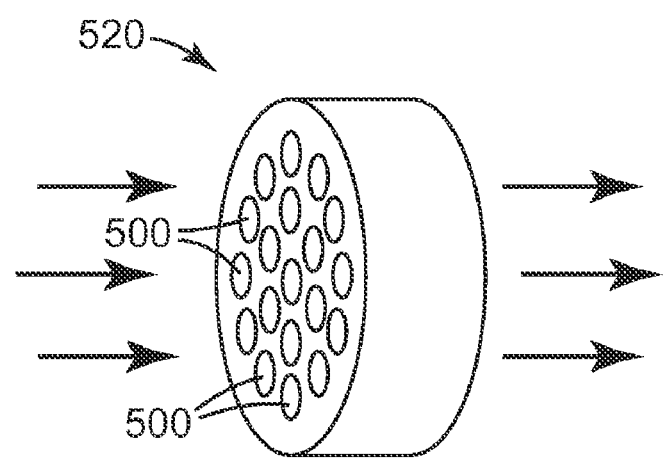
FIG. 15 schematically illustrates a catalyst system comprising an array of the catalytically active conduits of FIG. 14.

FIGS. 14 and 15 schematically illustrate representative modes of practicing the present invention. FIG. 14 schematically shows a catalytically active conduit system 500 of the present invention. Conduit system 500 includes a cylindrical wall 502 that defines flow-through channel 504 extending from inlet 506 to outlet 508. Although conduit system 500 includes a cylindrical sidewall 502, any suitable geometry may be used. A fluid to be catalytically processed flows through channel 504 as depicted by arrows 505 and 507. The inner surface 510 of wall 502 is at least partially coated with catalytically active particles 512 of the present invention. Preferably, the inner surface 510 of wall 502 is coated with the particles 512 as fully as possible.

Inner surface 510 desirably carries a charge, e.g., an electrostatic or electret charge, to promote adherence of particles 512 to the surface. Consequently, inner surface 510 desirably is formed from a dielectric material to facilitate such charging. Conventional techniques may be used to provide such charges. Several methods are commonly used to charge dielectric materials, any of which may be used to charge surfaces used in the present invention. These include corona discharge, heating and cooling the material in the presence of a charged field, contact electrification, spraying the web with charged particles, and wetting or impinging a surface with water jets or water droplet streams. In addition, the chargeability of the surface may be enhanced by the use of blended materials or charge enhancing additives. Examples of charging methods also are disclosed in the following patents: U.S. Pat. Nos. 6,752,889; 5,496,507; 5,472,481; 5,057,710; 4,592,815; 4,313,741; 4,234,324; 4,215,682; 3,998,916; 3,550,257; Re 30,782; Re 31,285; as well as in Japanese Kokai application Nos. 7-144108; 7-241491; 10-174823; 56-10312; and 56-10313. Each of these U.S. and Japanese patent documents is incorporated herein by reference in its respective entirety for all purposes.

The dimensions of the cylindrical wall 502 and the flow-through channel 504 may vary over a wide range. However, if the cross-sectional area of channel 504 is too large, the relative proportion of flowing fluid that is catalytically treated may be reduced. In other words, the volumetric flow rate of flowing fluid may be too high to be as fully catalytically processed by the catalytically active inner surface 510 as might be desired. On the other hand, if the cross-sectional area of the channel 504 is too small, then it may be more difficult in actual practice to effectively coat the inner surface 510 with catalytically active particles. Additionally, the pressure drop through channel 504 could increase too much as well. Balancing these concerns, using a channel with a cross-sectional area in the range of 0.5 mm$^2$ to 8.0 mm$^2$ would be suitable in illustrative modes of practice.

In illustrative embodiments, the catalytically active particles 512 are very finely sized, e.g., having a size in the range of 0.5 nm to 35 nm, while the coating of the particles 512 has a thickness in the range of 0.02 mm to 0.05 mm. This means that the coating of particles 512 occupies a de minimis percentage of the total volume of channel 504. In other words, inner surface 510 is rendered catalytically active, yet channel 504 is largely unobstructed. Consequently, there is a very low pressure drop of fluid flowing through channel 504, even when inner surface 510 is coated with extremely fine, catalytically active particles.

FIG. 15 shows how a plurality of conduit systems 500 can be arranged in an array 520 which is shaped to fit inside pipe.

Using such an array 520 allows a high volumetric flow rate of fluid to be processed with minimal pressure drop. Using multiple flow-through channels as provided by array 520 allows the ratio of the catalytically active surface area to the volumetric flow rate to be suitably high so that as much of the full flow of the fluid is catalytically processed as is desired. In contrast, if only a single flow through channel having generally the same overall cross-sectional area were to be used, the ratio of the catalytically active surface area to the volumetric flow rate might be too low to achieve the desired degree of processing.

Figure 16:
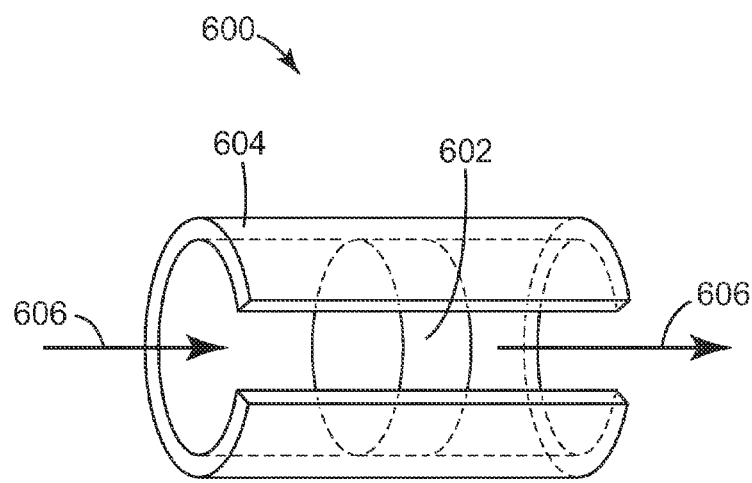
FIG. 16 schematically illustrates a conduit system of the present invention in perspective, with a portion of the enclosure taken away to allow the array positioned in the interior to be viewed.
Figure 17:
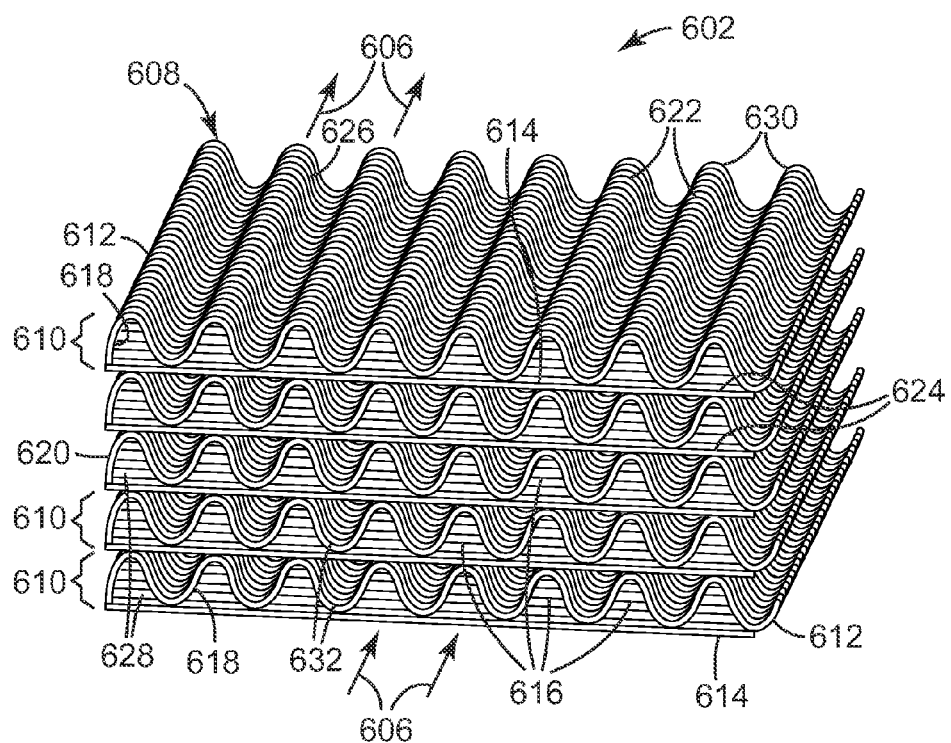
FIG. 17 is a schematic, perspective view of a portion of the array of catalytically active conduits used in FIG. 16.

In preferred embodiments as depicted in FIGS. 16 and 17, composite catalyst particles of the present invention with a guest/host structure are coated onto a catalytically active array 600 such as those described in U.S. Pat. No. 6,752,889 (the entirety of which is incorporated herein by reference for all purposes) or as commercially available under the trade designation 3M High Air Flow (HAF) filters from 3M Company, St. Paul, Minn. These arrays generally include a plurality of open pathways, or flow channels, extending from one side of the media to the other. Even though the composite catalyst particles might only coat the surfaces of these channels, leaving large open volumes through the channels for air streams to pass, it has been found that substantially all CO in air streams passing through the media nonetheless is catalytically oxidized with virtually no pressure drop. Most preferably, the composite catalyst particles of this embodiment are formed from titania guest particles coated onto carbon host particles (such as the Kuraray GG activated carbon particles). The catalytically active gold may be deposited onto the titania particles before the composite particles are assembled. Alternatively, the gold can be deposited onto the assembled composite particles.

The HAF media may include volatile constituents that may have a tendency to outgas over time. It may be desirable to remove these outgassing species from the HAF media prior to loading the media with catalyst. Removing these species can be accomplished using conventional techniques, including heating, placing under a vacuum, combinations of these, and/or the like.

FIG. 16 schematically shows catalytically active, flow through system 600 that includes disk-shaped array 602 fit inside a suitable flow through vessel such as pipe section 604. Fluid flows through the system as depicted by flow lines 606.

FIG. 17 shows a portion 608 of disk-shaped array 602 in more detail. Array 602 includes a plurality of stacked flow channel layers 610 formed by alternating contoured film layers 612 and an adjacent cap layers 614. The array 602 includes a plurality of flow-through channels 616 extending from inlets 618 on one major face 620 of the array 602 to outlets (not shown) on the other major face. Catalytically active particles of the present invention (schematically shown by the contour lines 622 and 624) are provided on the inner surfaces 626 and 628 of the flow channels 616. Array 602 formed from these structures provides an ordered or engineered and mechanically stable and uniform porous structure without the pore size variability and gross irregularities of nonwoven filter webs. As a result, the fluid stream is subjected to uniform treatment as it passes through the flow channels 616 of the array 602. The array 602 is relatively stable and resistant to breakage caused by manipulation, for example, pleating, handling, or assembly. Fiber breakage in traditional fibrous filters can cause a number of problems, especially in clean room application. Array 602 may be used as is or mounted, or otherwise assembled into a final useable format.

Contoured film layer 612 generally undulates in a repeating and uniform pattern to form a plurality of upward projecting peaks 630 and downward projecting peaks 632. The peaks 630 and 632 are stabilized by adhesion or other attachment to an adjacent cap layer 614. A particular cap layer 614 and the associated contoured film layer 612 define the fluid channels 616 between adjacent peaks 630 and 632 of the contoured film layer 612 in contact or engagement with the film cap layer 614. The contoured film layers 612 and cap layers 614 may be bonded together such as disclosed in U.S. Pat. Nos. 6,752,889; 5,256,231. After the cap and contoured layers 614 and 612 of array 602 are bonded together, the assembly is preferably formed into its final form by slicing the array 602 such as with a hot wire (not shown). The hot wire fuses the respective layers 612 and 614 together as the final filter form is being cut. This fusing of the layers is at the outermost face or faces of the final filter. As such at least some of the adjacent layers of the filtration media array need not be joined together prior to the hot wire cutting. The hot wire cutter speed can be adjusted to cause more or less melting or fusing of the respective layers. For example, the hot wire speed could be varied to create higher or lower fused zones. Hot wires could be straight or curved to create filters of an unlimited number potential shapes including rectangular, curved, oval, or the like. Also, hot wires could be used to fuse the respective layers of the filtration media array without cutting or separating filters. For example, a hot wire could cut through the filtration media array fusing the layers together while maintaining the pieces on either side of the hot wire together. The pieces re-fuse together as they cool, creating a stable filtration media array.

The peak to peak height of contoured film layer 612 desirably is a minimum of about 1 mm, preferably at least 1.2 mm and most preferably at least 1.5 mm so that the pressure drop through the flow channels 616 is minimized. Yet, these dimensions allow the inner surfaces 626 and 628 of the flow channels to be coated with catalytically active particles. However, if the peak to peak height is greater than about 10 mm the structures may become less stable than might be desired, and catalytic efficiency may be less than would be desired except for arrays having very long channels 616, e.g. channels having a length of greater than 100 cm or longer. A preferred peak to peak height is in the range of about 1.5 mm to about 6 mm.

The flow channels 616 generally have an average cross sectional area along their length of at least about 1 mm$^2$ preferably at least about 2 mm$^2$ where preferably a minimum cross sectional area is at least 0.2 mm$^2$, preferably at least 0.5 mm$^2$. The maximum cross sectional area to achieve the desired catalytic efficiency is generally up to about 1 cm$^2$ or less, preferably about 0.5 cm$^2$ or less.

The shape of the flow channels 616 is defined by the contours of the contoured film layer and the overlying cap layer or adjacent attached contoured film layer. Generally the flow channels 616 can be any suitable shape, such as bell shaped, triangular, rectangular or irregular in shape. The flow channels 616 of a single flow channel layer are preferably substantially parallel and continuous across the contoured film layer. However, flow channels 616 of this type on adjacent flow channel layers can be at angles relative to each other. Also, these flow channels 616 of specific flow channel layers can extend at angles relative to the inlet opening face or outlet opening face of the filtration media array.

The flow channels 616 provide controlled and ordered fluid flow pathways through the array 602. The amount of surface area available for catalytic activity is determined by available surface area of the flow channels 616 and the number and length of these flow channels 616 in the array 602.

To increase the total surface area available for adhering catalytically active particles, the surfaces of layers 612 and

614 desirably may include suitable microstructure features (not shown) on one or both faces. High aspect ratio, microstructured features are preferred. The high aspect ratio structures used on the contoured film and/or cap film layers 612 and 614 of the preferred embodiments generally are structures where the ratio of the height to the smallest diameter or width is greater than 0.1, preferably greater than 0.5 theoretically up to infinity, where the structure has a height of at least about 20 microns and preferably at least 50 microns. If the height of the high aspect ratio structure is greater than 2000 microns the film can become difficult to handle and it is preferable that the height of the structures is less than 1000 microns. The height of the structures is in any case desirably about 50 percent or less of the height of the flow channels 616, preferably about 20 percent or less. As shown in FIG. 1-4 and 11 of U.S. Pat. No. 6,752,889, the structures on the layers 612 and 614 can be in the shape of upstanding stems or projections, e.g., pyramids, cube corners, J-hooks, mushroom heads; continuous or intermittent ridges; e.g., rectangular or v-shaped ridges with intervening channels; combinations thereof, and the like. These projections can be regular, random or intermittent or be combined with other structures such as ridges. The ridge type structures can be regular, random intermittent, extend parallel to one another, or be at intersecting or nonintersecting angles and be combined with other structures between the ridges, such as nested ridges or projections.

Generally, the high aspect ratio structures can extend over all or just a region of a surface. When present in a region, the structures provide a surface area at least 50 percent higher than a corresponding planar film lacking such features, preferably at least 100 percent higher, generally up to 1000 percent or higher. In a preferred embodiment, the high aspect ratio structures are continuous or intermittent ridges that extend across a substantial portion of the contoured film layer 612 at an angle to the contours, preferably octagonal (90 degrees) to the contours of the contoured film layer as shown. This reinforces the mechanical stability of the contoured film layer 612.

The structured features can be made by any known method of forming a structured film, such as the methods disclosed in U.S. Pat. Nos. 5,069,403 and 5,133,516, both to Marantic et al., U.S. Pat. No. 5,691,846 to Benson et al.; U.S. Pat. No. 5,514,120 to Johnston et al.; to U.S. Pat. No. 5,175,030 to Lu et al.; U.S. Pat. No. 4,668,558 to Barber; U.S. Pat. No. 4,775,310 to Fisher; U.S. Pat. No. 3,594,863 to Erb or U.S. Pat. No. 5,077,870 to Melbye et al. These patents are all incorporated by reference in their entireties for all purposes.

The contoured film layers 612 are preferably provided with a high aspect ratio structure over at least 50 percent of at least one face of each layer 612 and 614, preferably at least 90 percent, more preferably about 100 percent. Cap layers 614 can also be formed with these high aspect ratio structured films.

The contoured film layers 612 and the cap layers 614 are desirably made from one or more thin, dielectric, flexible polymer films or laminates of such films independently having a total thickness of less than 200 microns, preferably less than 100 microns down to about 5 microns. Thicker films are possible but generally increase pressure drop without any added benefit to performance or mechanical stability. The thickness of the layers forming the array 602 generally are such that cumulatively less than 50 percent of the cross sectional area of the array 602 at the inlets 618 or outlets is formed by the layer materials, preferably less than 10 percent.

Polymers useful in forming layers 612 and 614 include but are not limited to polyolefins such as polyethylene and polyethylene copolymers, polypropylene and polypropylene copolymers, polyvinylidene diflouride (PVDF), and polytetrafluoroethylene (PTFE). Other polymeric materials include acetates, cellulose ethers, polyvinyl alcohols, polysaccharides, polyesters, polyamides, poly(vinyl chloride), polyurethanes, polyureas, polycarbonates, and polystyrene. Structured film layers can be cast from curable resin materials such as acrylates or epoxies and cured through free radical pathways promoted chemically, by exposure to heat, UV, or electron beam radiation. Preferably, the film layers 612 and 614 are formed of polymeric material capable of being charged namely dielectric polymers and blends such as polyolefins or polystyrenes.

Polymeric materials including polymer blends can be modified through melt blending of plasticizing active agents or antimicrobial agents. Surface modification of a filter layer can be accomplished through vapor deposition or covalent grafting of functional moieties using ionizing radiation. Methods and techniques for graft-polymerization of monomers onto polypropylene, for example, by ionizing radiation are disclosed in U.S. Pat. Nos. 4,950,549 and 5,078,925. The polymers may also contain additives that impart various properties into the polymeric structured layer.

The layers 612 and/or 614 are generally charged and are preferably electrostatically or electretly charged to improve adherence of the catalytically active particles. Electrostatic charging preferably occurs while the film is contoured in the case of the contoured film layer 612, but could be charged before or after contouring, if desired.

The charged layers 612 and 614 are characterized by surface voltages of at least about +/−1.5 KV, preferably at least about +/−10 KV, measured approximately one centimeter from the film surface by an electrostatic surface voltmeter (ESVM), such as a model 341 Auto Bi-Polar ESVM, available from Trek Inc., Medina, N.Y. The electrostatic charge may comprise an electret, which is a piece of dielectric material that exhibits an electrical charge that persists for extended time periods. Electret chargeable materials include nonpolar polymers such as polytetrafluoroethylene (PTFE) and polypropylene. Generally, the net charge on an electret is zero or close to zero and its fields are due to charge separation rather than being due to a net charge. Through the proper selection of materials and treatments, an electret can be configured that produces an external electrostatic field. Such an electret can be considered an electrostatic analog of a permanent magnet.

Several methods are commonly used to charge dielectric materials, any of which may be used to charge a contoured film layer 612 or other layers used in the present invention, including corona discharge, heating and cooling the material in the presence of a charged field, contact electrification, spraying the web with charged particles, and wetting or impinging a surface with water jets or water droplet streams. In addition, the chargeability of the surface may be enhanced by the use of blended materials or charge enhancing additives. Examples of charging methods are disclosed in the following patents: U.S. Pat. No. RE 30,782 to van Turnhout et al., U.S. Pat. No. RE 31,285 to van Turnhout et al., U.S. Pat. No. 5,496,507 to Angadjivand et al., U.S. Pat. No. 5,472,481 to Jones et al., U.S. Pat. No. 4,215,682 to Kubik et al., U.S. Pat. No. 5,057,710 to Nishiura et al. and U.S. Pat. No. 4,592,815 to Nakao.

Another type of optional treatment is the use of fluorochemical additives in the form of material additions or material coatings which can improve a filter layer's ability to repel oil and water, as well as enhance the ability to process oily aerosols. Examples of such additives are found in U.S. Pat.

No. 5,472,481 to Jones et al., U.S. Pat. No. 5,099,026 to Crater et al., and U.S. Pat. No. 5,025,052 to Crater et al., the respective entireties of which are incorporated herein by reference for all purposes.

Catalyst systems of the present invention desirably include upstream protection features that help to reduce the risk that the catalytically active gold might be poisoned or otherwise impaired. For instance, in some modes of practice, an upstream particulate filter, such as a nonwoven filter medium, could be used to help prevent exposing the catalytically active gold to particulate contamination. Upstream media having the ability to filter organic vapor contaminants such as aldehydes, mercaptans, and amines could also be used. Upstream filter media could also include filter media incorporating a wide range of functional impregnants (e.g., the so-called whetlerite type carbons) or reactive adsorbents such as hopcalite to protect the gold against contact with other contaminants such as ammonia, acids, bases, water, and cyanogen chloride.

The present invention will now be further described in the following illustrative examples.

In the examples, the following terms are used:

HAF refers to a high air flow filter media available from 3M Co., St. Paul, Minn., under the trade designation 3M HIGH AIR FLOW GREEN ANTIMICROBIAL E106.

Hombikat refers to a titania available under the trade designation Hombikat UV 100 from Sachtleben Chemie GmbH, Duisberg, Germany.

ST31 refers to the titania available under the trade designation ST31 from Ishihara Sangyo Kaisha, Ltd., Osaka, Japan.

GG Carbon refers to the 12×20 mesh coconut-based, organic vapor activated GG carbon available from Kuraray Chemical Co., Ltd., Osaka, Japan.

$Au/TiO_2$ Catalyst refers to nanoparticulate, catalytically active gold on an agglomerated titania support, prepared in accordance with the teachings provided in PCT Patent Publication No. WO 2005/030382A2.

Au/TiO2/GG Catalyst refers to nanoparticulate, catalytically active gold supported on a titania-coated GG carbon or other carbon particles as noted, prepared in accordance with the teachings provided in PCT Patent Publication No. WO 2005/030382A2.

Pressure Drop

Pressure drop is determined by placing a test sample over a air tight fixture attached to a vacuum pump, a flow meter and a digital pressure meter. The desired flow is set, the pressure is zeroed, and the sample is placed on the vacuum fixture. The digital reading in negative mm H2O is recorded.

Test Procedure 1: CO Challenge Testing

Figure 4:
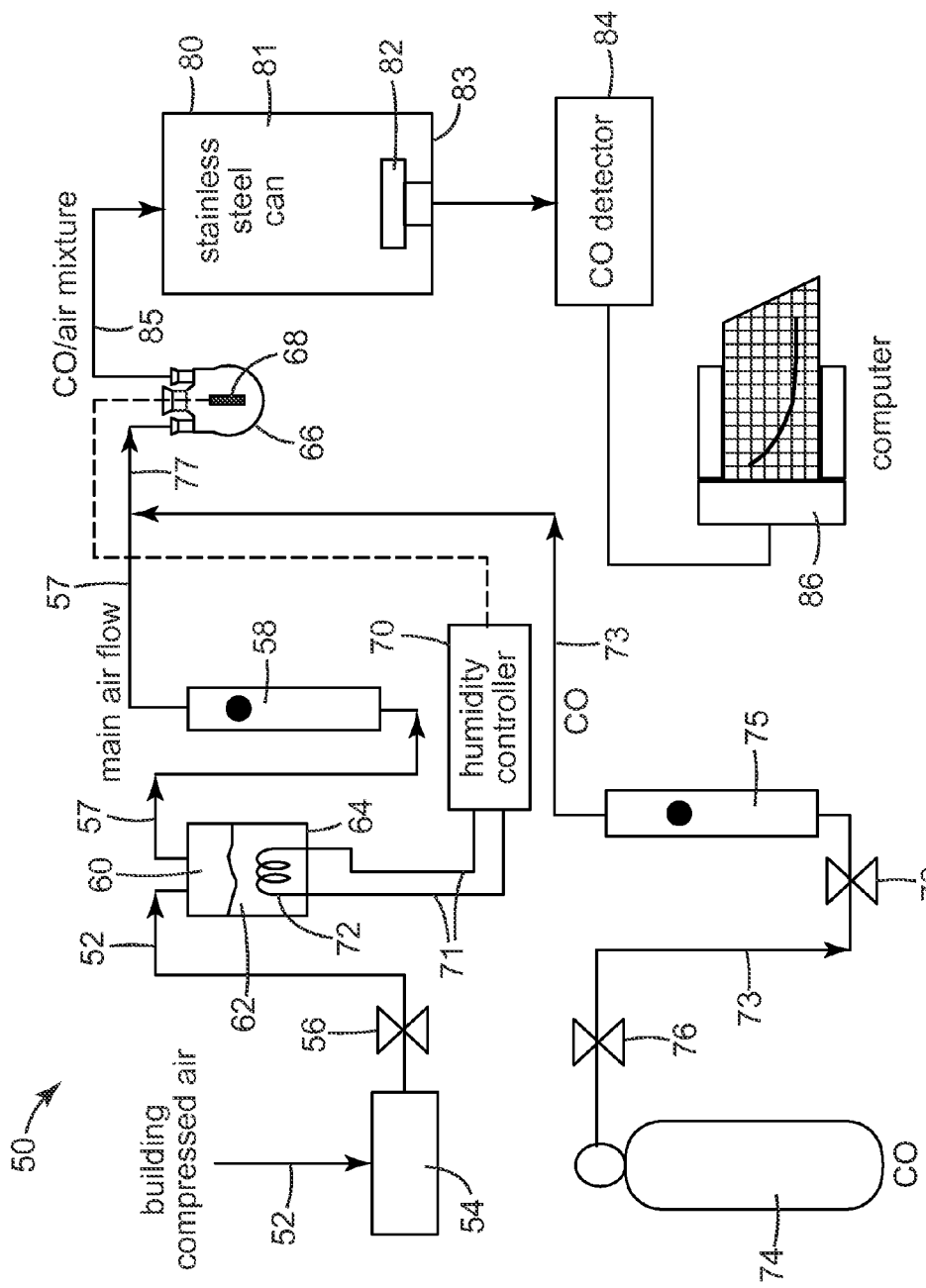
FIG. 4 schematically shows a testing system that was used to subject samples to CO challenges in order to assess catalytic characteristics for oxidizing CO.

FIG. 4 shows testing system 50 used to subject catalyst samples to CO challenges in order to assess their performance as CO oxidation catalysts. High-pressure compressed air from supply line 52 is reduced in pressure, regulated, and filtered by regulator 54 (3M Model W-2806 Air Filtration and Regulation Panel, 3M, St. Paul, Minn.) to remove particulates and oils. Valve 56 (Hoke Inc., Spartanburg, S.C.) is used to set the desired main airflow rate as measured by a flow meter 58 (Gilmont®, Barnant Co, Barrington, Ill.) with a range of 0 to 90 LPM. The flow meter 58 was calibrated using a dry gas test meter (American Meter, model DTM-325; not shown). The main airflow passes through the headspace 60 above a heated distilled water bath 62 of vessel 64 and then passes via lines 57 and 77 into a 500 ml mixing flask 66. Relative humidity in the mixing flask is monitored using a RH sensor 68 (Type 850-252, General Eastern, Wilmington, Mass.). The RH sensor 68 provides an electrical signal to a humidity controller 70 (an Omega Engineering PID controller series CN1200 from Omega Engineering Inc., Stamford, Conn.) that delivers power via lines 71 to a submerged heater 72 to maintain the RH at the set point. Unless otherwise indicated, the relative humidity is controlled at >90%.

A cylinder 74 of carbon monoxide (Praxair, Inc., Danbury, Conn. 98.5%) equipped with a regulator 76 suitable for CO service provides a regulated flow of CO gas via line 73. A Gilibrator® bubble flow meter 75 (Sensidyne, Inc., Clearwater, Fla.) measures volumetric CO flow rate in the range 20 mL/min to 6 L/min. A stainless steel, fine metering valve 78 (Swagelok Co, part SS-SS2, Solon, Ohio) is used to set the desired CO flow rate. The metered CO is combined with the humidified air in the mixing flask 66. This system can deliver mixtures of CO and air at concentrations from about 1000 ppm CO to about 20,000 ppm CO at flow rates from about 15 L/min to about 80 L/min at RH values from about 5% to approximately 95%. More dilute mixtures for detector calibration were generated by replacing the cylinder of carbon monoxide 74 with a cylinder of a certified mixture of CO in air or nitrogen (typically from 500 to 5000 ppm CO; Quality Standards, Pasadena, Tex.).

The combined stream then flows via line 85 into an inverted, 12-quart, stainless steel beaker 80 with a 29/42 outer joint welded into the top closably engaging a support platform 83 defining test chamber 81. Inside the beaker 80 is a test fixture 82. The beaker 80 is sealed to support platform 83 using a foam gasket (not shown). Two clamps (not shown) ensure a tight seal to the support platform 83. The beaker 80 can be removed to allow catalyst test fixtures to be placed inside for testing and taken out after testing is complete. The support platform 83 is equipped with an inner 29/42 tapered fitting (not shown) onto which the fixture 82 containing the catalyst to be tested is mounted.

The CO concentration from the test stream emerging from the outlet of the test chamber is measured by CO detector system 84. The results are processed via computer 86. Two embodiments of CO detector system 84 are preferred. In one embodiment, CO detector system 84 includes an SRI 8610C gas chromatograph (SRI Instruments, Torrance, Calif.) equipped with a gas sampling valve and a detector that responds to CO. A diaphragm pump (KNF Neuberger, Inc., Trenton N.J. UNMP830 KNI) continuously draws approximately 50 mL/min of sample from the test outlet through the gas sampling valve of the GC. Periodically the valve injects a sample onto a 3 ft 13× molecular sieve column. CO is separated from air and its concentration measured by either a helium ionization detector (minimum detectable CO concentration about 10 ppm) or a methanizer/FID detector (minimum detectable CO concentration less than 1 ppm). The GC is calibrated using CO in air mixtures generated using the test system described above. Results of this calibration agree to within 3% of those from certified standard CO in air or nitrogen mixtures in the range from 500 to 5000 ppm CO (Quality Standards, Pasadena, Tex.). Each CO analysis takes about 3 minutes. After completion of the analysis, another sample is injected onto the column and the analysis repeated.

In another embodiment, CO detection system 84 uses a Brü& Kjær Multigas Monitor Type 1302 (Brüel & Kjær, Nærum, Denmark; not shown) equipped with optical filter #984 to detect CO. The Multigas Monitor is calibrated using the test system described above. The temperature of the air stream is monitored downstream of the test fixture using a K-type thermocouple (not shown) and digital readout (not shown) (Fluke 51 K/J Thermometer, Fluke Corporation, Everett, Wash.).

To begin the test, test fixture 82 containing the catalyst is placed on the 29/42 fitting on the support platform 83. The beaker 80 is replaced and sealed to the support platform 83. Outlet CO concentration measurements begin when the CO/air mixture is introduced into the test chamber 81. Measurements continue for a specified time period, typically 30 minutes.

Gold Application Method: Process for Deposition of Gold Nanoparticles onto Substrate Particles:

The apparatus described in the detailed description and shown in FIGS. 2 and 3 is used as follows to prepare catalytic materials according to the following procedure, unless expressly noted otherwise. 300 cc of substrate particles are first heated to about 200° C. in air overnight (120° C., or even up to about 150° C., in the case of carbon substrates) to remove residual water. They are then placed into the particle agitator apparatus 10 while hot, and the chamber 14 is then evacuated. Once the chamber pressure is in the $10^{-5}$ torr range, the argon sputtering gas is admitted to the chamber 14 at a pressure of about 10 to 15 millitorr, typically 10 millitorr unless noted. The gold deposition process is then started by applying a pre-set power to the cathode. The particle agitator shaft 40 is rotated at about 4 rpm during the gold deposition process. The power is stopped after the pre-set time. The chamber 14 is backfilled with air, and the gold coated particles are removed from the apparatus 10. The gold sputter target 32 is weighed before and after coating to determine the amount of gold deposited. In general, about 20% of the weight loss of the target represents gold deposited on the sample.

During the deposition process the gap between the blades 42 and the chamber wall was set to a pre-set value, e.g., 1.7 mm to 2.7 mm or even more if comminution is desirably avoided.

Example 1

Sputtered Au On $TiO_2$/Kuraray GG Carbon: Effect Of Step Change in CO Inlet Concentration This sample was prepared by sputter coating gold onto 300 mL of Kuraray GG 12×20 mesh, activated carbon that had been coated with 10% Ishihara ST-31 titania dispersed in DI water.

22.1 grams of ST-31 titania (Ishihara Sangyo Kaisha, LTD, Tokyo, Japan) was dispersed into 160 grams of deionized water utilizing an IKA Ultra Turrax T18 homogenizer (IKA Works, Inc., Wilmington, Del.). The slurry was spritzed (pumping the titania dispersion with a peristaltic pump (Cole Palmer Instruments Co, Chicago, Ill., model wz1r057) at 150 gr/min through a Qorpak finger-actuated trigger-sprayer (Qorpak, Bridgeville, Pa.) as a fine mist) onto 200 grams of Kuraray GG 12×20 mesh activated carbon that was mixed in a 1 gallon steel reactor rotating at 18 rpm at 20 degree angle. After the granules were coated, a heat gun was used to remove enough water to allow the granules to flow freely in the rotating reactor. The coated granules were dried at 120 C in an oven for approximately 2 hours giving a uniform white coating. The sample was further dried at 150° C. for 24 hours. 129.54 grams of the sample was coated with 0.88 grams gold (weight loss from the target) deposited via PVD. The coater used an agitator with a height of 2.7 cm, blade gap of 1.7 mm, and the holed blade was rotated at 4 rpm. The background pressure was $8.7 \times 10^{-5}$ ton. The sputter power was 0.03 kw for 1 hour.

Figure 9:
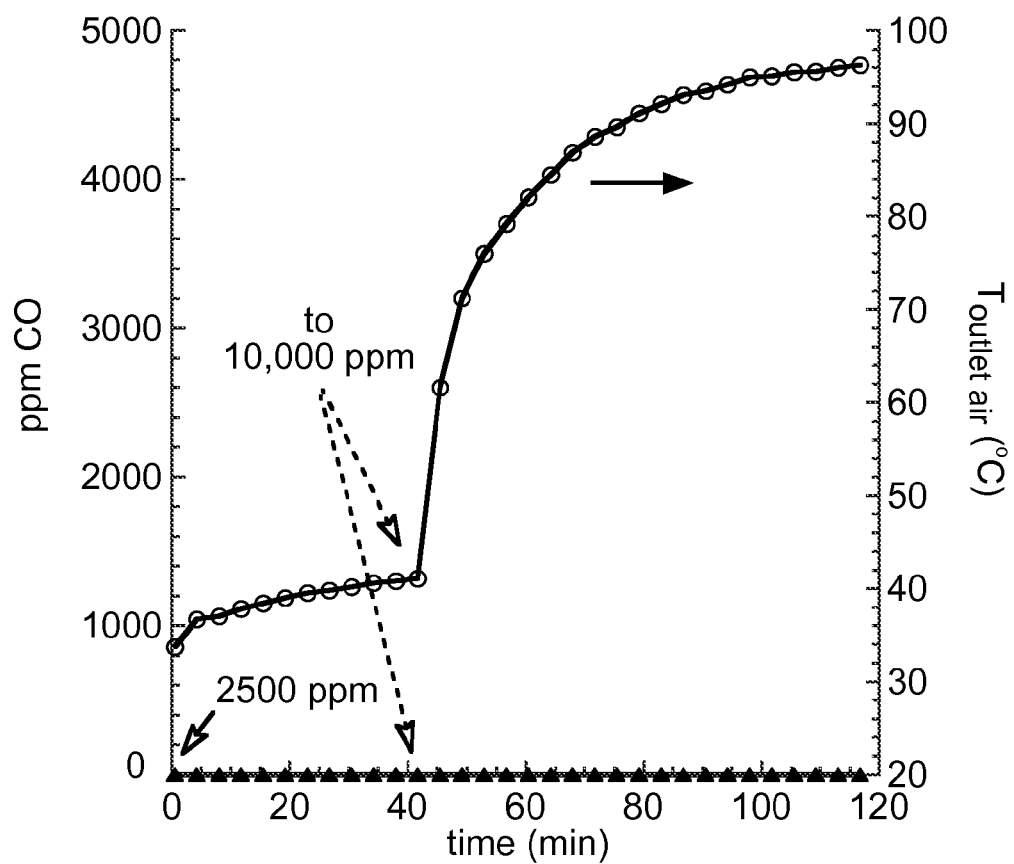
FIG. 9 is a graph demonstrating the effect of step change in CO inlet concentration under conditions itemized in Example 1.

100 mL of the sample (43.1 g) was tested (test procedure 1) against a CO challenge at 30 L/min in a 3.5 inch diameter aluminum test fixture. Test relative humidity (RH) was 93%. A thermocouple at the filter exit measured air temperature. The GC used in this test is equipped with a methanizer/FID detector that is capable of detecting CO at levels below 1 ppm. The initial CO challenge concentration at the beginning of the test was 2500 ppm. No CO was detected at the filter outlet during the course of this challenge. The temperature of the air at the filter outlet (open circles on the graph) increased steadily and reached about 41° C. after about 40 minutes. At about 42 minutes into the test, the inlet CO concentration was increased suddenly to 10,000 ppm. Still, no CO was observed at the filter outlet. Air temperature at the outlet began to rise sharply and reached about 96° C. at the end of the test. The fast response to a sudden change in inlet CO concentration observed with this catalyst in this test is highly desirable in a respirator filter against CO. The test results are shown in FIG. 9.

The data depicted by the open circles shows the temperature at the outlet during the course of the test. The data depicted by the black triangles shows the measured CO content at the outlet. The response of the filtering system to the stepwise increase in CO in the challenge stream was so rapid that no discernible spike in CO at the outlet was detected.

Example 2

Sputtered Au on $TiO_2$/Kuraray GG Carbon: Lesser Amount of Catalyst Material

Figure 10:
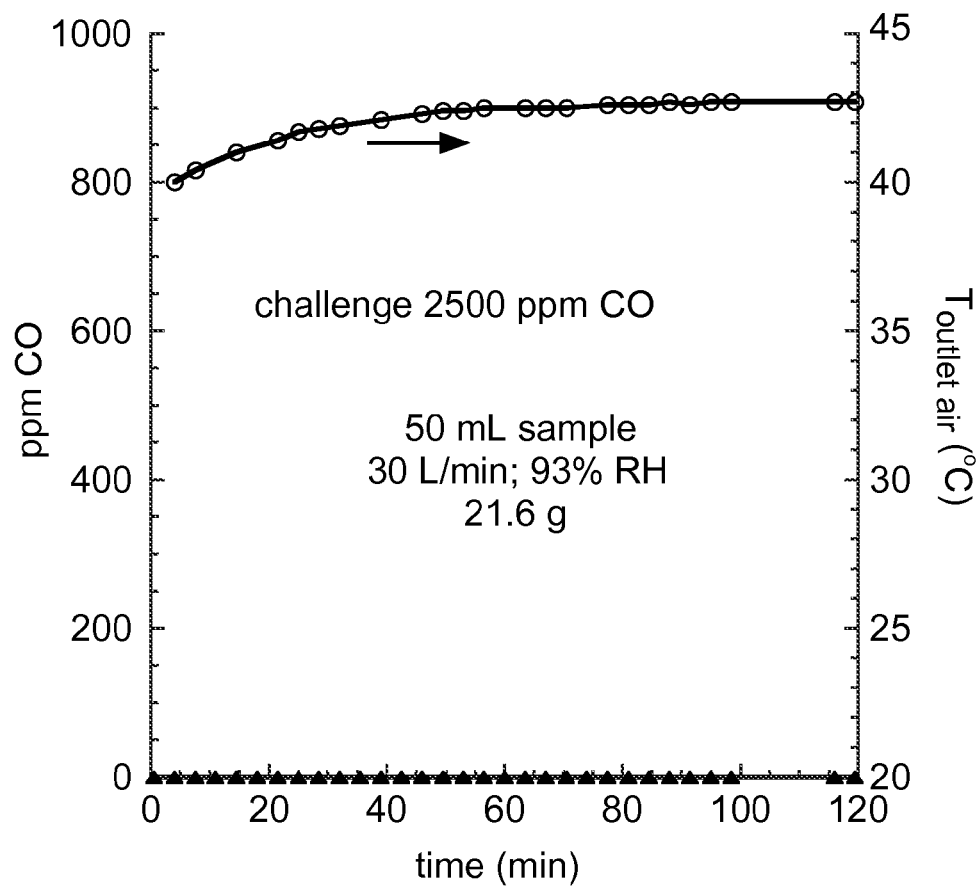
FIG. 10 is a graph demonstrating the results of Example 2.

The test of Example 1 was repeated, except only 50 mL of the same catalyst was used. Further, the CO challenge was held at 2500 ppm (no stepwise increase to 10,000 ppm was used in this test). The test results are shown in FIG. 10. The data depicted by the open circles show the temperature data at the outlet, and the data depicted by the black triangles show the detected CO data at the outlet. No CO was detected at the filter outlet during the entire 120 minutes of testing. The temperature of the air at the filter outlet (open circles on the graph) increased slightly and then remained steady at about 42.7° C. This example illustrates the extremely high activity for CO oxidation of the catalysts of the present invention.

Example 3

Sputtered Au on $TiO_2$/Kuraray GG Carbon: Effect of Step Change in CO Inlet Concentration at Higher Flow Rate This sample was prepared by sputter coating gold onto 300 mL of Kuraray GG 12×20 activated carbon that had been coated with 10% Hombikat UV100 titania dispersed in DI water. 22.1 grams of Hombikat UV 100 (Sachtleben Chemie Gmbh, Duisburg, Germany) was dispersed into 150 grams of deionized water utilizing an IKA Ultra Turrax T18 homogenizer (IKA Works, Inc., Wilmington, Del.). The slurry was spritzed (pumping the titania dispersion with a peristaltic pump (Cole Palmer Instruments Co, Chicago, Ill., model wz1r057) at 150 gr/min through a Qorpak finger-actuated trigger-sprayer (Qorpak, Bridgeville, Pa.) as a fine mist) onto 200 grams of Kuraray GG 12×20 mesh activated carbon that was mixed in a rotating 1 gallon steel reactor rotating at 18 rpm at 20 degree angle. After the granules were coated, a heat gun was used to remove enough water to allow the granules to flow freely in the rotating reactor. The coated granules were dried at 120° C. in an oven for approximately 2 hours giving a uniform white coating. The sample was further dried at 150° C. for 24 hours. 126 grams of the sample was coated with 1.34 grams gold (weight loss from the target). The coater used an agitator with a height of 2.7 cm, blade gap of 2.7 mm, and the holed blade was rotated at 4 rpm. The background pressure was $8.50 \times 10^{-5}$ torr. The sputter power was 0.04 kW for 1 hour.

50 mL of the sample was tested (test method 1) as in Example 1, but at 64 L/min flow instead of the 30 L/min. As further differences, the CO challenge concentration at the beginning of the test was 1200 ppm, and the inlet CO concentration was increased suddenly to 10,000 ppm at about 60 minutes. ΔP of the sample in the fixture was 18.5 mm $H_2O$ at 85 L/min. Test RH was >90%.

Figure 11:
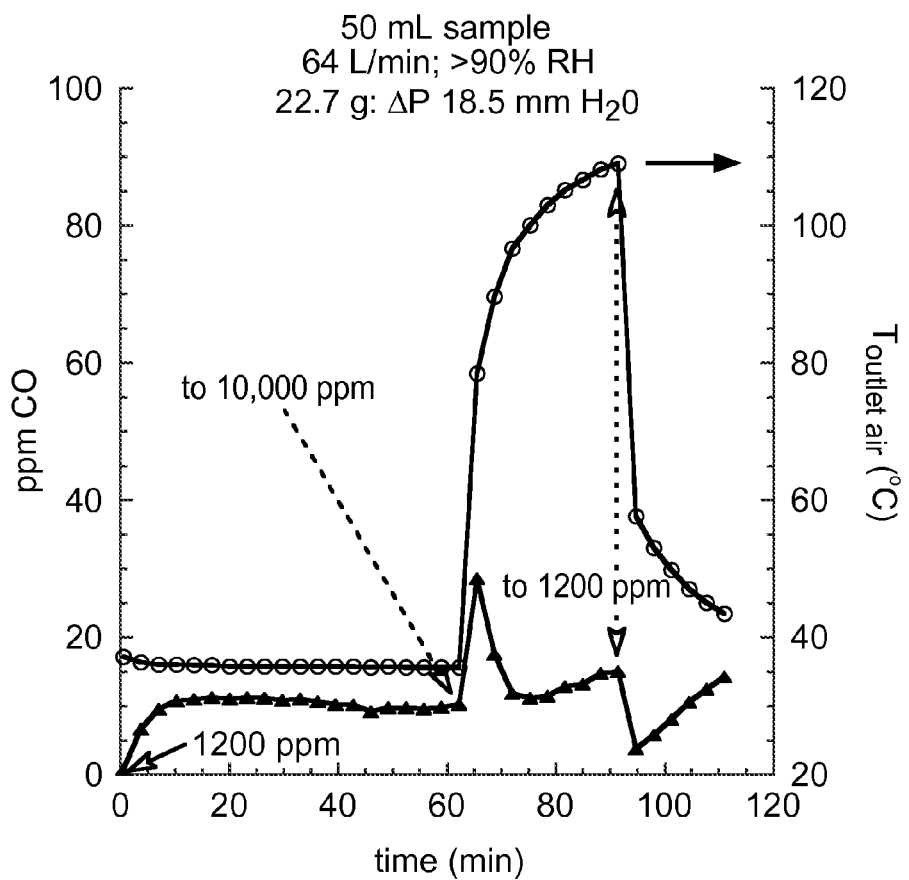
FIG. 11 is a graph demonstrating the results of Example 3.

The results are shown in the graph of FIG. 11. The data depicted by the open circles show the temperature data at the outlet, and the data depicted by the black triangles show the detected CO data at the outlet. CO concentration at the outlet of the filter quickly reached a plateau of about 10 to 11 ppm. Almost no temperature spike from the interaction of water vapor in the wet challenge gas with the dry catalyst was observed. The temperature of the air at the filter outlet (open circles) remained steady at about 36° C. After the CO challenge was stepwise increased to 10,000 ppm, the CO concentration at the outlet moderately spiked upward but quickly dropped back to 12-15 ppm. Air temperature at the outlet began to rise sharply and reached about 109° C. After about 90 minutes, the CO inlet concentration was reduced back to 1200 ppm. The catalyst continued to function even as the temperature dropped to less than 50° C. The catalyst in this example increased in weight by 0.8 g during the test.

The outlet CO concentration during this test also was monitored with a B&K gas analyzer. This device can analyze the CO content of a sample about every minute while the GC takes about 3 minutes to complete an analysis. The maximum CO concentration measured by the B&K was 111 ppm.

The fast response to a sudden change in inlet CO concentration observed with this catalyst in this test is highly desirable in a respirator filter against CO. The response of this sample to the stepwise increase was much faster and much more moderate than the response of the sample in Comparative Example A (below) in which an alumina host was used.

Example 4

12.5 wt Percent Hombikat on GG Carbon Coated in a Deionized Water Slurry 28.5 grams of Hombikat UV 100 (Sachtleben, Germany) was dispersed into 160 grams of deionized water utilizing an IKA Ultra Turrax T18 homogenizer (IKA Works, Inc., Wilmington, Del.). The slurry was spritzed (pumping the titania dispersion with a peristaltic pump (Cole Palmer Instruments Co, Chicago, Ill., model wz1r057) at 150 gr/min through a Qorpak finger-actuated trigger-sprayer (Qorpak, Bridgeville, Pa.) as a fine mist onto 200 grams of Kuraray GG 12×20 mesh activated carbon that was mixed in a 1 gallon steel reactor rotating at 18 rpm at 20 degree angle. After the granules were coated, a heat gun was used to remove enough water to allow the granules to flow freely in the rotating reactor. The coated granules were dried at 120° C. in an oven for approximately 2 hours giving a uniform white coating. The sample was further dried at 150° C. for 24 hours. 126 grams of the sample was coated with 6.98 grams gold (weight loss from the target) using PVD techniques. The coater used an agitator with a height of 2.7 cm and the holed blade was rotated at 4 rpm. The background pressure was $7.90 \times 10^{-5}$ torr. The sputter power was 0.12 kW for 2 hour.

Example 5

10 wt Percent ST-31 on GG Carbon Coated in a Deionized Water Slurry 22.1 grams of ST-31 (Ishihara, Japan) was dispersed into 160 grams of deionized water utilizing an IKA Ultra Turrax T18 homogenizer (IKA Works, Inc., Wilmington, Del.). The slurry was spritzed (pumping the titania dispersion with a peristaltic pump (Cole Palmer Instruments Co, Chicago, Ill., model wz1r057) at 150 gr/min through a Qorpak finger-actuated trigger-sprayer (Qorpak, Bridgeville, Pa.) as a fine mist onto 200 grams of Kuraray GG 12×20 mesh activated carbon that was mixed in a 1 gallon steel reactor rotating at 18 rpm at 20 degree angle. After the granules were coated, a heat gun was used to remove enough water to allow the granules to flow freely in the rotating reactor. The coated granules were dried at 120° C. in an oven for approximately 2 hours giving a uniform white coating. The sample was further dried at 150° C. for 24 hours. 133 grams of the sample was coated with 3.56 grams gold (weight loss from the target) using PVD techniques. The coater used an agitator with a height of 2.7 cm and the holed blade was rotated at 4 rpm. The background pressure was $1.020 \times 10^{-5}$ torr. The sputter power was 0.12 kW for 1 hour.

Example 6

12.5 wt Percent ST-31 on GG Carbon Coated in a 0.5M KOH Slurry 28.5 grams of ST-31 (Ishihara, Japan) was dispersed into 160 grams of 0.5 M KOH utilizing an IKA Ultra Turrax T18 homogenizer (IKA Works, Inc., Wilmington, Del.). The slurry was spritzed (pumping the titania dispersion with a peristaltic pump (Cole Palmer Instruments Co, Chicago, Ill., model wz1r057) at 150 gr/min through a Qorpak finger-actuated trigger-sprayer (Qorpak, Bridgeville, Pa.) as a fine mist onto 200 grams of Kuraray GG 12×20 mesh activated carbon that was mixed in a 1 gallon steel reactor rotating at 18 rpm at 20 degree angle. After the granules were coated, a heat gun was used to remove enough water to allow the granules to flow freely in the rotating reactor. The coated granules were dried at 120° C. in an oven for approximately 2 hours giving a uniform white coating. The sample was further dried at 150° C. for 24 hours. 143 grams of the sample was coated with 6.56 grams gold (weight loss from the target) using PVD techniques. The coater used an agitator with a height of 2.7 cm and the holed blade was rotated at 4 rpm. The background pressure was $9.0 \times 10^{-5}$ torr. The sputter power was 0.24 kW for 1 hour.

Example 7

10 wt Percent ST-31 on GG Carbon Coated in a 0.5M KOH Slurry 22.1 grams of ST-31 (Ishihara, Japan) was dispersed into 160 grams of 0.5 M KOH utilizing an IKA Ultra Turrax T18 homogenize (IKA Works, Inc., Wilmington, Del.). The slurry was spritzed (pumping the titania dispersion with a peristaltic pump (Cole Palmer Instruments Co, Chicago, Ill., model wz1r057) at 150 gr/min through a Qorpak finger-actuated trigger-sprayer (Qorpak, Bridgeville, Pa.) as a fine mist onto 200 grams of Kuraray GG 12×20 mesh activated carbon that was mixed in a rotating 1 gallon steel reactor rotating at 18 rpm at 20 degree angle. After the granules were coated, a heat gun was used to remove enough water to allow the granules to flow freely in the rotating reactor. The coated granules were dried at 120° C. in an oven for approximately 2 hours giving a uniform white coating. The sample was further dried at 150° C. for 24 hours. 137 grams of the sample was coated with 6.34 grams gold (weight loss from the target) using PVD techniques. The coater used an agitator with a height of 2.7 cm and the holed blade was rotated at 4 rpm. The background pressure was $1.06 \times 10^{-5}$ torr. The sputter power was 0.24 kw for 1 hour.

Example 8

CO Catalytic Performance for Samples 4-7

Figure 8:
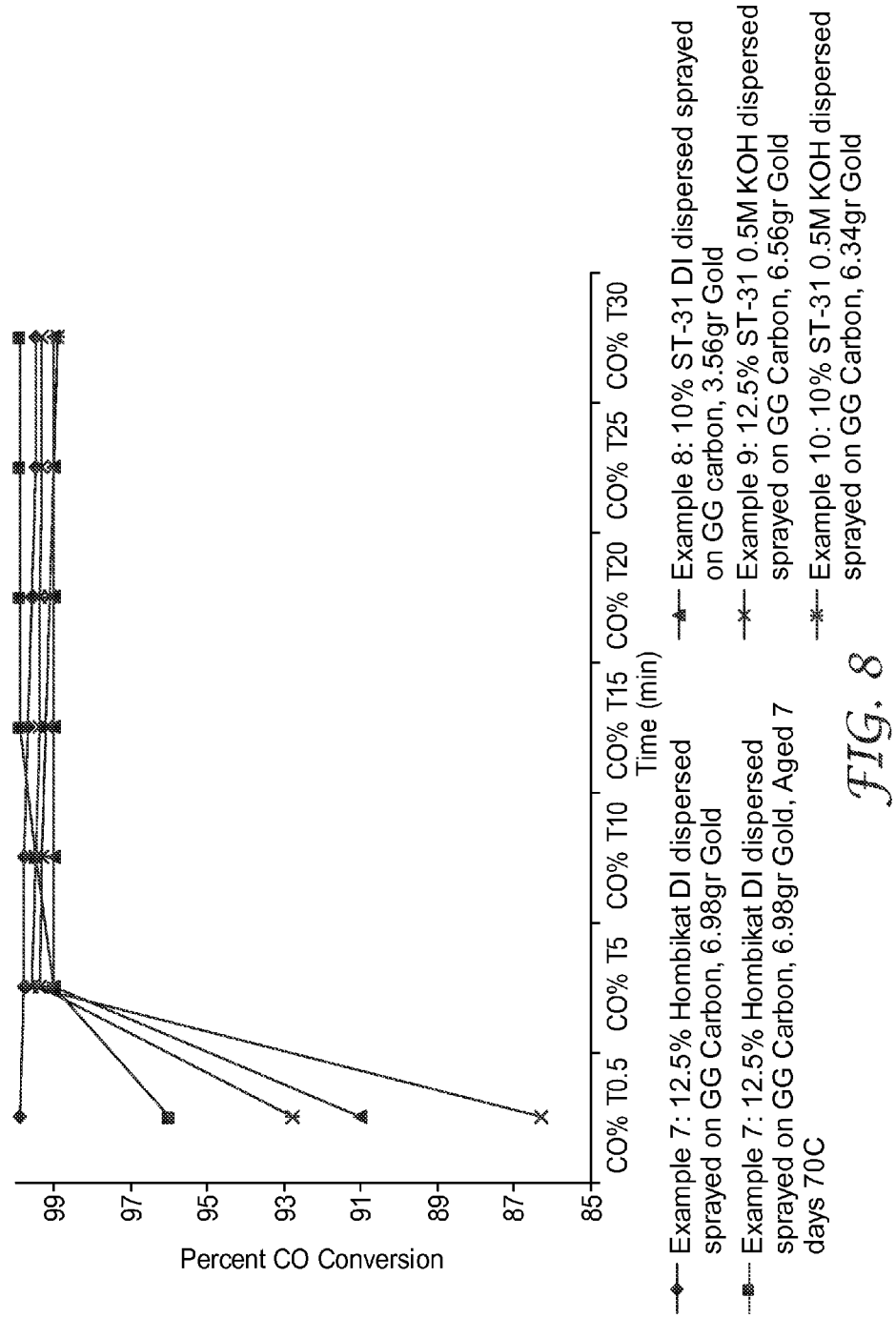
FIG. 8 is a graph demonstrating the effectiveness by which the catalysts of Examples 4 through 7 catalyze CO.

The following table shows the performance of Samples 4 through 7 with respect to CO oxidation. The performance of these samples is also depicted in FIG. 8.

| Sample Number | Sample Description | CO % T0.5 | CO % T5 | CO % T10 | CO % T15 | CO % T20 | CO % T25 | CO % T30 |
|---|---|---|---|---|---|---|---|---|
| 4 | 12.5% Hombikat DI dispersed sprayed on GG Carbon, 6.98 g Gold | 99.9 | 99.8 | 99.8 | 99.7 | 99.6 | 99.5 | 99.5 |
| 4 | 12.5% Hombikat DI dispersed sprayed on GG Carbon, 6.98 g Gold, Aged 7 days 70 C | 96 | 99 | 99.5 | 99.9 | 99.9 | 99.9 | 99.9 |
| 5 | 10% ST-31 DI dispersed sprayed on GG carbon, 3.56 g Gold | 91 | 99 | 99 | 99 | 99 | 99 | 99 |
| 6 | 12.5% ST-31 0.5M KOH dispersed sprayed on GG Carbon, 6.56 g Gold | 86.3 | 99.6 | 99.5 | 99.4 | 99.4 | 99.3 | 99.3 |
| 7 | 10% ST-31 0.5M KOH dispersed sprayed on GG Carbon, 6.34 g Gold | 92.8 | 99.4 | 99.3 | 99.2 | 99.1 | 99 | 98.9 |

Comparative Example A

Sputtered Au on $TiO_2$/Washed Alcoa 450 Alumina: Effect of Step Change in CO Inlet Concentration This sample was prepared by sputter coating gold onto 300 mL of washed Alcoa 450 alumina beads that had been coated with 10% Hombikat UV100 titania dispersed in 0.5 M $K_2CO_3$ solution.

The titania coated Alcoa 450 alumina beads were prepared in the following manner. A colorant dispersion comprising $\gamma$-$Fe_2O_3$ in water was prepared by washing 30.07 g of $\gamma$-$Fe_2O_3$ (Sigma Aldrich Fine Chemicals, Milwaukee, Wis.) with 500 ml of deionized water by centrifugation. This material was then washed with 500 ml of a potassium carbonate solution prepared by dissolving 3.0 g of potassium carbonate in 500 ml of deionized water. The material was final washed with 500 ml of deionized water and was separated by centrifugation. The recovered solid was redispersed in deionized water to a concentration of 1.64% iron oxide by weight. This dispersion was used to provide color to the titania dispersion so as to be able to monitor the uniformity of the titania coated onto the Alcoa 450 alumina beads.

To prepare the Alcoa 450 alumina beads for use, about 1 liter of beads were immersed in 2 liters of deionized water. These were poured into a large buchner funnel attached to a filter flask. The wash water was allowed to drain from the funnel into the flask by means of gravity. The beads were further washed by the slow addition of 8 liters of deionized water. The beads were further separated from the wash water by applying aspirator vacuum to the funnel. The beads were dried at 140° C. in an oven and were placed in a sealed jar to cool prior to use.

A titania dispersion was prepared by mixing with a high shear mixer (IKA Ultra Turrax T18 mixer; IKA Works, Inc., Wilmington, Del.) 10.0 g of Hombikat UV100 titania (Sachtleben Chemie Gmbh, Duisburg, Germany) with 10.1 g of the $\gamma$-$Fe_2O_3$ colorant dispersion, 5.0 g potassium carbonate and 90.2 g of deionized water. This mixture was applied to 215.0 g of the washed Alcoa 450 alumina beads by spraying the dispersion through a Qorpak finger-actuated trigger-sprayer (Qorpak, Bridgeville, Pa.) as a fine mist onto a shallow bed of the Alcoa 450 alumina beads uniformly spread out on a glass tray. The bed of alumina beads was mixed gently using a rubber policeman after every 2 sprays to provide a uniform coating of the beads with the titania dispersion. After application, the coated beads were dried at 100° C. in an oven for one hour and then at 140° C. for 2 hours.

A catalyst sample of this material was prepared by sputter coating a 300 ml sample of the titania-coated Alcoa 450 alumina beads with gold according to deposition conditions: cathodic power 0.03 kW; sputter time—60 minutes; blade gap 6.9 mm; gold target weight loss 1.14 g.

Figure 12:
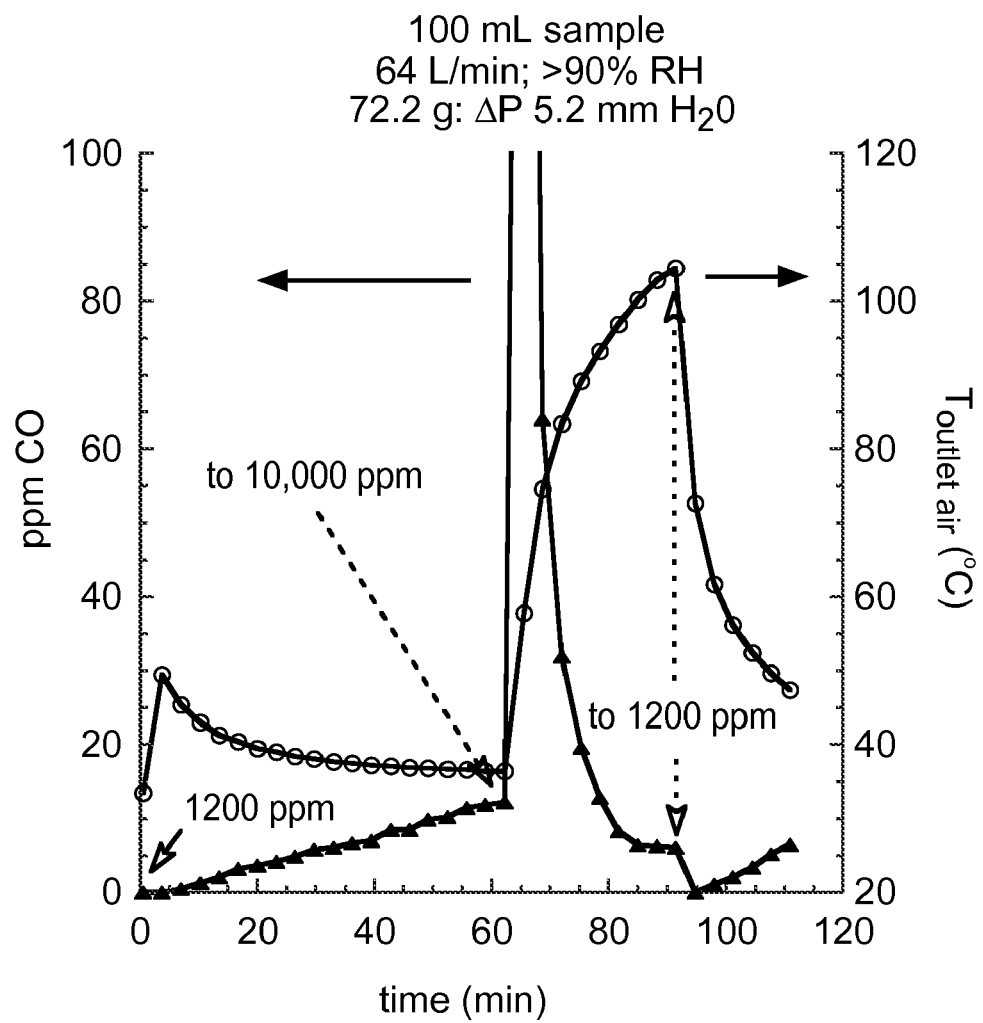
FIG. 12 is a graph demonstrating the results of Comparative Example A.

100 mL of the sample was tested (test procedure 1) under the same conditions as example 3. ΔP of the sample in the fixture was 5.2 mm $H_2O$ at 85 L/min. Test RH was >90%. The test results are shown in FIG. 12. The data depicted by the open diamonds show the temperature data at the outlet, and the data depicted by the black triangles show the detected CO data at the outlet. CO concentration at the outlet of the filter (solid triangles) increased slowly from 0 to about 12 ppm over an hour. The temperature of the air at the filter outlet (open circles) spiked to about 54° C. when the wet challenge air contacted the dry catalyst. This spike in temperature did not occur with the activated catalyst sample of example 3 in which the host was carbon. Temperature then slowly dropped to about 36.5° C. over an hour.

At about 60 minutes into the test the inlet CO concentration was increased suddenly to 10,000 ppm. CO concentration at the outlet spiked upward significantly before dropping back to about 6 ppm. The recovery time for this sample was slower than that for Example 3.

The outlet CO concentration during this test was also monitored with a B&K gas analyzer. This device can analyze the CO content of a sample about every minute while the GC takes about 3 minutes to complete an analysis. The maximum CO concentration measured by the B&K was 1170 ppm, which is an order of magnitude greater than the more moderate spike observed in Example 3. Air temperature at the outlet began to rise sharply and reached about 105° C.

After about 90 minutes, the CO inlet concentration was dropped back to 1200 ppm. The catalyst continued to function even as the temperature dropped to less than 50° C. The catalyst increased in weight by 7.7 g during the test. The alumina catalyst in this example allowed more CO to slip through the bed before low CO outlet concentrations were re-established than did the activated carbon catalyst in example 3.

Example 9

Sputtered Au on $TiO_2$/Kuraray GG Carbon: Effect on Physical Adsorption of Cyclohexane The catalyst was tested against a cyclohexane challenge to evaluate its capability for physical adsorption of organic vapors. Untreated Kuraray GG 12×20 activated carbon was tested as a control. A titania dispersion was prepared by mixing with a high shear mixer (IKA Ultra Turrax T18 mixer; IKA Works, Inc., Wilmington, Del.) 10.0 g of Hombikat UV100 titania (Sachtleben Chemie Gmbh, Duisburg, Germany) with 60. g of deionized water. This mixture was applied to 100 grams of 12×20 mesh Kuraray GG carbon particles by spraying the titania dispersion through a Qorpak finger-actuated trigger-sprayer (Qorpak, Bridgeville, Pa.) as a fine mist onto a shallow bed of the GG carbon uniformly spread out on a glass tray. The bed of carbon particles was mixed gently using a rubber spatula after each 1-2 sprays to provide a uniform coating of the titania dispersion on the carbon particles. After the addition of the titania, the titania-coated particles were dried at 100° C. in an oven for 30 minutes and then at 150° C. for 1 hour.

5 mL of each (2.1 g) were tested against a 1000 ppm cyclohexane challenge at 1.6 L/min using the method described in test procedure 2. The GC was equipped with a 6 ft 10% SE-30 on Chromosorb W-HP 80/100 column for analysis of cyclohexane instead of CO.

Figure 13:
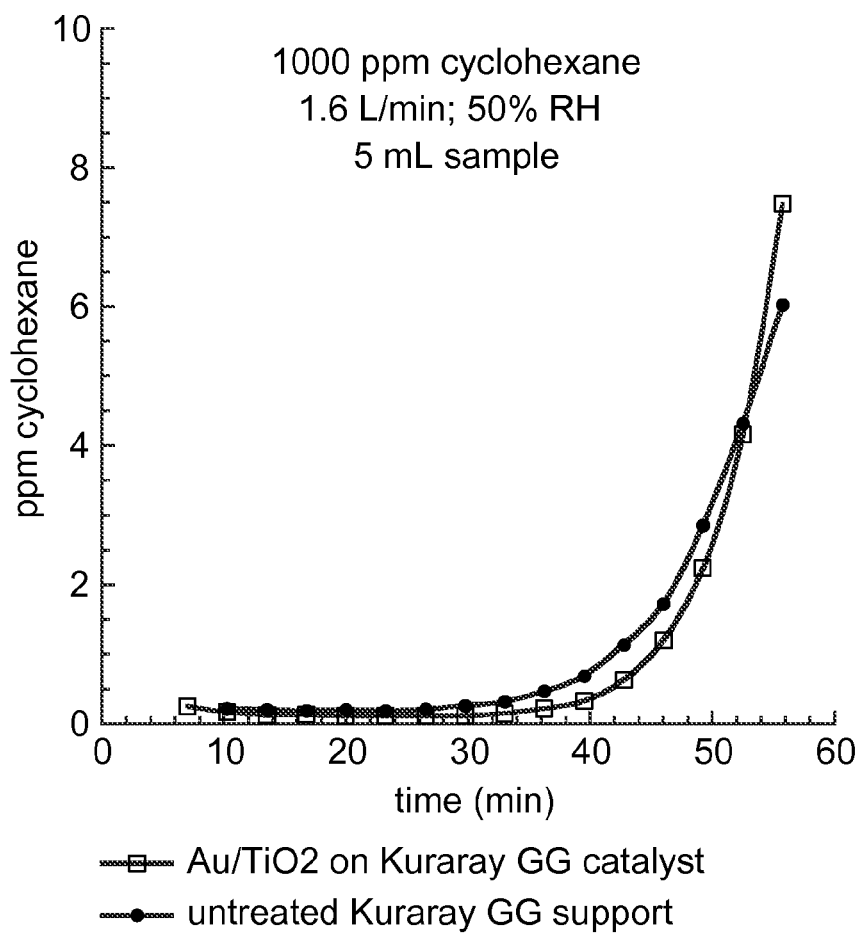
FIG. 13 is a graph demonstrating the results of Example 9.

The results are shown in FIG. 13. The abilities of both samples to protect against cyclohexane are quite similar. Surprisingly, the titania coating of the composite catalyst system did not unduly interfere with the fast transport of organic vapor molecules into the internal pore volume of the activated carbon support host. This illustrates that the carbon host incorporated into composite catalysts of the present invention retain appreciable capacity for physical adsorption. This dual functionality is advantageous for use in a respirator filter.

Example 10

An 18" RCD Rotocone rotary mixer-drier (Paul O. Abbe Co. Newark, N.J.) was charged with 5.00 kg of 12×20 Kuraray GG carbon (Kuraray Chemical Company, Ltd., Osaka, Japan) and 681. g of Hombikat UV100 nanoparticle titania (Sachtleben Chemie, Del.). The combination was mixed in the Rotocone mixer-drier for 30 seconds at 12 revolutions per minute. Mixing continued while 5.0 kg of distilled water was sprayed onto the mixture of carbon and Hombikat over a period of 10 minutes via a peristaltic pump through an 8 mil nozzle with a 110° fan. Vacuum (−25 in Hg) and heat (140° C. Sterlco model F6016-MX heater (Sterling Inc., New Berlin, Wis.) set point) were applied to the rotocone to dry the mixture. Agitation of the mixture was reduced to 0.5 revolutions per minute during drying with the rotocone. Drying was completed after 7.5 hours. This process was repeated and the two samples were combined.

Prior to PVD coating the sample was dried at 150° C. for 12 hours. 9,788 grams of the sample was coated with 109.3 grams gold (weight loss from the target; inductively couple plasma analysis showed that the coated particles included 0.55 weight percent of gold) deposited via PVD using the gold application method described above with the following differences. A larger capacity, but otherwise similar PVD coating apparatus was used. The coating chamber had a length of 19.75 inches and a 15.125 inch diameter. In this instance, the coater used an agitator with a blade gap of 4.7 mm, and the holed blade was rotated at 1 rpm. The background pressure was $6.8 \times 10^{-5}$ torr before initiating sputtering. The sputter power was 0.3 kw for 12 hours. The argon process gas was supplied at a pressure of 15 mtorr.

The catalyst was sieved through a Sweco mechanical siever with a 24 mesh screen to separate fines that are less than 704 micrometers in size. These fines weighed about 305 grams. This fine particulate component would normally have been set aside as too fine for use in a respirator. The catalyst was added to HAF media and tested as described further below in Example 17.

Example 11

AU/$TiO_2$ Loaded HAF

HAF media 13.3 cm in diameter by 2 cm thick was loaded with catalyst particles containing catalytically active Au deposited on Hombikat titania using the gold application method described above. No carbon was present. The samples were made by dusting both sides of the HAF media and shaking off excess particles multiple times. The Au coated $TiO_2$ was made via PVD according to the gold application method with a target loss of 9.35 g on 101.18 g Hombikat UV 100. The HAF had an initial mass of 29.71 g and 3.09 g of the Au coated $TiO_2$ was loaded into the media.

TABLE 1

| CO Data for Sample 11 at 16 LPM (liters per minute) | | |
|---|---|---|
| 0.5 | 0 | 100.00 |
| 4.25 | 0 | 100.00 |
| 8 | 0.29 | 99.99 |
| 11.75 | 1.6 | 99.96 |
| 15.5 | 3.3 | 99.91 |
| 19.25 | 5.4 | 99.86 |
| 23 | 8.1 | 99.78 |
| 26.75 | 10.5 | 99.72 |
| 30.5 | 13.0 | 99.65 |

The flow was increased to 64 LPM, hence the CO concentration dropped to 930 ppm at 70% RH.

TABLE 2

| CO Data for Sample 11 at 64 LPM | | |
|---|---|---|
| 0.5 | 17.2 | 98.16 |
| 4.25 | 492.3 | 47.27 |

TABLE 2-continued

CO Data for Sample 11 at 64 LPM

| | | |
|---|---|---|
| 8 | 591.5 | 36.66 |
| 11.75 | 617.9 | 33.83 |
| 15.5 | 629.8 | 32.56 |
| 19.25 | 641.9 | 31.26 |
| 23 | 647.4 | 30.67 |
| 26.75 | 661.7 | 29.13 |
| 30.5 | 656.9 | 29.65 |

Examples 12-16

Au on Titania

Samples of HAF loaded with catalyst particles containing catalytically active Au on $TiO_2$ were prepared as detailed in below, using the PVD methods according to the gold application method described previously. All examples were made using 13.3 cm diameter by 2 cm thick HAF media discs as described in example 11.

TABLE 3

Examples 12-16

| Example # | $TiO_2$ type/Au sputter weight | Catalyst Weight (grams)[b] | 85 LPM Pressure drop (mmH$_2$O) |
|---|---|---|---|
| 12 | Hombikat/9.35 | 3.19 | 0.2 |
| 13 | Hombikat/31.7 | 3.48 | 0.2 |
| 14 | ST-31/9.77 | 2.8 | 0.2 |
| 15 | ST-31/27.79 | 2.02 | 0.2 |
| 16 | KOH Hombikat/9.71[a] | 4.62 | 0.4 |

[a]as in Example 6.
[b]refers to the total weight of catalyst particles loaded on the HAF media.

The CO data for Examples 12-16 were all acquired with a 64 LPM challenge flow of 3760 ppm CO (for #12, 13, and 14) or 3720 ppm CO with >90% RH (#15 & 16).

TABLE 4

CO Data for Sample 12 at 64 LPM

| | | |
|---|---|---|
| 0.5 | 856.0 | 77.24 |
| 4.25 | 3306.8 | 12.10 |
| 8 | 3394.1 | 9.77 |
| 11.75 | 3424.2 | 8.97 |
| 15.5 | 3441.0 | 8.53 |
| 19.25 | 3453.5 | 8.19 |
| 23 | 3463.4 | 7.93 |
| 26.75 | 3474.4 | 7.64 |
| 30.5 | 3481.4 | 7.45 |

TABLE 5

CO Data for Sample 13 at 64 LPM

| | | |
|---|---|---|
| 0.5 | 759.5 | 79.81 |
| 4.25 | 3104.6 | 17.47 |
| 8 | 3256.9 | 13.42 |
| 11.75 | 3295.9 | 12.38 |
| 15.5 | 3316.4 | 11.84 |
| 19.25 | 3333.27 | 11.39 |
| 23 | 3336.7 | 11.30 |
| 26.75 | 3351.4 | 10.91 |
| 30.5 | 3365.7 | 10.53 |

TABLE 6

CO Data for Sample 14 at 64 LPM

| | | |
|---|---|---|
| 0.5 | 1536.8 | 59.15 |
| 4.25 | 3409.4 | 9.37 |
| 8 | 3467.3 | 7.83 |
| 11.75 | 3492.0 | 7.17 |
| 15.5 | 3508.5 | 6.73 |
| 19.25 | 3517.0 | 6.51 |
| 23 | 3521.9 | 6.38 |
| 26.75 | 3526.2 | 6.26 |
| 30.5 | 3537.5 | 5.96 |

TABLE 7

CO Data for Sample 15 at 64 LPM

| | | |
|---|---|---|
| 0.5 | 1549.4 | 58.32 |
| 4.25 | 3191.3 | 14.14 |
| 8 | 3278.9 | 11.79 |
| 11.75 | 3319.8 | 10.69 |
| 15.5 | 3346.0 | 9.98 |
| 19.25 | 3366.1 | 9.44 |
| 23 | 3374.0 | 9.23 |
| 26.75 | 3395.0 | 8.66 |
| 30.5 | 3401.0 | 8.50 |

TABLE 8

CO Data for Sample 16 at 64 LPM

| | | |
|---|---|---|
| 0.5 | 422.6 | 88.63 |
| 4.25 | 2113.4 | 43.14 |
| 8 | 2463.0 | 33.74 |
| 11.75 | 2539.3 | 31.68 |
| 15.5 | 2513.5 | 32.38 |
| 19.25 | 2451.6 | 34.04 |
| 23 | 2379.6 | 35.98 |
| 26.75 | 2305.6 | 37.97 |
| 30.5 | 2243.5 | 39.64 |

Example 17

Fine Au/TiO$_2$/GG Catalyst Loaded HAF

A HAF disc (30.19 g), 13.3 cm diameter and 2 cm thick was loaded with a catalyst sample from Example 10. This fine particulate component would normally have been set aside as too fine for use in a respirator. After saturation with the catalyst, the HAF sample weighed 52.7 grams. Thus it held about 22.5 grams of catalyst. The loaded sample was placed over a 13.3 cm diameter piece of a 20 micrometer BMF web to keep stray particles of the catalyst from shedding into the sample stream. Pressure drop was tested at 85 lpm and measured 2.2 mmH$_2$O. The pressure drop of the BMF by itself is 1.8 mmH$_2$O. Therefore, the HAF disc with catalyst had a pressure drop of 0.4 mmH$_2$O by difference. The CO Test was performed at 64 LPM, with a 3940 ppm CO challenge and >90% RH.

TABLE 9

Example 17 CO Test Data.

| | | |
|---|---|---|
| 0 | 0 | 100 |
| 0:03:45 | 0 | 100 |
| 0:07:30 | 0 | 100 |
| 0:11:15 | 0 | 100 |
| 0:15:00 | 0 | 100 |

TABLE 9-continued

Example 17 CO Test Data.

| | | |
|---|---|---|
| 0:18:45 | 0 | 100 |
| 0:22:30 | 0 | 100 |
| 0:26:15 | 0 | 100 |
| 0:30:00 | 0 | 100 |
| 0:33:45 | 0 | 100 |
| 0:37:30 | 0 | 100 |
| 0:41:16 | 0 | 100 |
| 0:45:01 | 0 | 100 |

The sample was left on the test fixture overnight, but the humidity control was turned off. After 17 hours of exposure, the humidity had dropped to <15%; and the CO measured on the output had increased to only 1.5 ppm, still providing a conversion of 99.96%.

This example also demonstrates the performance that results from the ability to load catalyst containing carbon onto the HAF media at high levels, as carbon is very retainable on the HAF media.

Example 18

Fine Au/TiO$_2$/GG Catalyst Loaded HAF

GG 12×20 standard mesh carbon was ground with a mortar and pestle to a cut between 150 and 300 nm (50×100 mesh). The sample was then coated with 33 wt % Hombikat UV100 titania, which was treated with a 0.2 molar KOH aqueous solution according to the procedures referenced in Example 6, and subsequently coated with catalytically active Au (8.1 g. sputter loss) according to the gold application method described herein.

A HAF disc, 13.3 cm diameter and 2 cm thick, was loaded with the catalyst sample until saturation. The total mass of supported catalyst was 18.10 g. The loaded sample was placed over a 13.3 cm diameter piece of BMF to keep stray particles of the catalyst from shedding into the sample stream. Pressure drop was tested at 85 lpm and measured 1.7 mmH$_2$O. The pressure drop of the BMF alone was 1.3 mmH$_2$O, thus the loaded disk was found to be 0.4 mmH$_2$O by difference.

TABLE 10

CO Test Data for Example 18.

| | | |
|---|---|---|
| 0.5 | N/A | 100 |
| 4.25 | 0.65 | 99.98 |
| 8 | 0.29 | 99.99 |
| 11.75 | 0.56 | 99.98 |
| 15.5 | 0.56 | 99.98 |
| 19.25 | 0.51 | 99.99 |
| 23 | 1.18 | 99.97 |
| 26.73 | 2.12 | 99.94 |
| 30.5 | 3.2 | 99.91 |

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A catalyst system, comprising:
   a) a fluid conduit having an inner surface defining at least a portion of a flow-through channel; and
   b) a plurality of nanoporous particles provided on at least a portion of the inner surface, wherein a catalyst is provided on the particles, the catalyst comprising a plurality of gold clusters having a size in the range of about 0.5 nm to about 50 nm.

2. The system of claim 1, wherein the particles are adhered to the inner surface of the conduit.

3. The system of claim 2, wherein an electric force helps to adhere the particles to the inner surface.

4. The system of claim 3, wherein the electric force comprises an electret charge.

5. The system of claim 1, wherein the particles comprise a multiphasic surface.

6. The system of claim 1, wherein the particles comprise aggregates of nanoparticles, said aggregates having a size in the range of about 0.2 microns to about 3 microns and said nanoparticles having a size in the range of about 3 nm to about 35 nm.

7. A catalyst system, comprising:
   a) a fluid conduit having an inner surface defining at least a portion of a flow-through channel; and
   b) a plurality of composite particles provided on at least a portion of the inner surface, said composite particles having a guest/host structure comprising a plurality of nanoporous guest particles and a plurality of host particles, wherein a catalyst is provided on the guest particles, the catalyst comprising a plurality of gold clusters having a size in the range of about 0.5 nm to about 50 nm.

8. The system of claim 7, wherein the composite particles are adhered to the inner surface of the conduit.

9. The system of claim 8, wherein an electric force helps to adhere the composite particles to the inner surface.

10. The system of claim 9, wherein the electric force comprises an electret charge.

11. The system of claim 7, wherein the guest particles comprise a multiphasic surface.

12. The system of claim 7 wherein the guest particles comprise aggregates of nanoparticles, said aggregates having a size in the range of about 0.2 microns to about 3 microns and said nanoparticles having a size in the range of about 3 nm to about 35 nm.

13. The system of claim 7, wherein the host particles have a size in the range of about 3 microns to about 1000 microns.

14. The system of claim 7, wherein the guest particles comprise titania and the host particles comprise carbon or alumina.

15. The system of claim 7, wherein the host particles comprise carbon and incorporate potassium carbonate.

16. A method of making a catalyst system, comprising the steps of:
   a) providing a plurality of nanoporous particles wherein a catalyst is provided on the particles, the catalyst comprising a plurality of gold clusters having a size in the range of about 0.5 nm to about 50 nm;
   b) providing a fluid conduit having an inner surface defining at least a portion of a flow-through channel; and
   c) causing the particles to be supported on at least a portion of the inner surface.

17. The method of claim 16, wherein an electric force helps to adhere the particles to the inner surface.

18. The method of claim 17, wherein the electric force comprises an electret charge.

19. The method of claim 16, comprising the step of using physical vapor deposition to deposit the gold clusters onto the particles.

20. A method of making a catalyst system, comprising the steps of:

a) providing a plurality of composite particles having a guest/host structure comprising a plurality of nanoporous guest particles and a plurality of host particles, wherein a catalyst is provided on the guest particles, the catalyst comprising a plurality of gold clusters having a size in the range of about 0.5 nm to about 50 nm;
b) providing a fluid conduit having an inner surface defining at least a portion of a flow-through channel; and
c) causing the composite particles to be supported on at least a portion of the inner surface.

21. The method of claim 20, wherein an electric force helps to adhere the composite particles to the inner surface.

22. The method of claim 21, wherein the electric force comprises an electret charge.

23. The method of claim 20, wherein the guest particles comprise titania and the host particles comprise carbon or alumina.

24. The method of claim 20, comprising the step of using physical vapor deposition to deposit the gold onto the guest particles.

* * * * *

UNITED STATES PATENT AND TRADEMARK OFFICE
CERTIFICATE OF CORRECTION

PATENT NO. : 7,955,570 B2  
APPLICATION NO. : 12/279768  
DATED : June 7, 2011  
INVENTOR(S) : Thomas I Insley et al.

Page 1 of 2

It is certified that error appears in the above-identified patent and that said Letters Patent is hereby corrected as shown below:

Page 2, Column 2 under Other Publications:
Line 9, delete "acethylacetonate" and insert -- acetylacetonate --, therefor.

Column 4
Line 17, delete ""[a]lthough" and insert -- "although --, therefor.

Column 4
Line 52, delete "10/948,012," and insert -- 10/948,012, bearing attorney docket no. --, therefor.

Column 4
Line 59, delete "11/275,416," and insert -- 11/275,416, bearing attorney docket no. 6002US03, --, therefor.

Column 6
Line 45, delete "possible" and insert -- possibly --, therefor.

Column 6
Line 66, after "60/773,866," insert -- Attorney Docket No. 60293US002, --.

Column 7
Line 3, after "60/774,045," insert -- Attorney Docket No. 61525US002, --.

Column 7
Line 29, delete "Lpm" and insert -- LPM --, therefor.

Column 10
Line 49, delete "know" and insert -- known --, therefor.

Signed and Sealed this  
Twenty-fifth Day of October, 2011

David J. Kappos  
*Director of the United States Patent and Trademark Office*

CERTIFICATE OF CORRECTION (continued)
U.S. Pat. No. 7,955,570 B2

Column 21
Line 4, delete "adsorb." and insert -- absorb. --, therefor.

Column 24
Line 44, delete "poly-phasic" and insert -- polyphasic --, therefor.

Column 26
Line 42, delete "(vida" and insert -- (vide --, therefor.

Column 26
Line 42, after "infra)" insert -- . --.

Column 34
Line 2, delete "diflouride" and insert -- difluoride --, therefor.

Column 36
Line 60, delete "Brü&" and insert -- Brüel & --, therefor.

Column 37
Line 64, delete "ton." and insert -- torr. --, therefor.

Column 47
Line 27, delete "nm" and insert -- μm --, therefor.